(12) United States Patent
Richardson

(10) Patent No.: US 12,451,377 B2
(45) Date of Patent: Oct. 21, 2025

(54) ROBOTIC COVER SEALER

(71) Applicant: MicroCircuit Laboratories, LLC, Kennett Square, PA (US)

(72) Inventor: Richard D. Richardson, Kennett Square, PA (US)

(73) Assignee: MicroCircuit Laboratories, LLC, Kennett Square, PA (US)

( * ) Notice: Subject to any disclaimer, the term of this patent is extended or adjusted under 35 U.S.C. 154(b) by 0 days.

(21) Appl. No.: 18/858,306

(22) PCT Filed: Apr. 1, 2024

(86) PCT No.: PCT/US2024/022537
§ 371 (c)(1),
(2) Date: Oct. 19, 2024

(87) PCT Pub. No.: WO2024/207014
PCT Pub. Date: Oct. 3, 2024

(65) Prior Publication Data
US 2025/0112060 A1    Apr. 3, 2025

Related U.S. Application Data

(60) Provisional application No. 63/456,354, filed on Mar. 31, 2023.

(51) Int. Cl.
*H01L 21/67* (2006.01)
*B23K 1/00* (2006.01)
*B23K 101/40* (2006.01)

(52) U.S. Cl.
CPC ...... *H01L 21/67126* (2013.01); *B23K 1/0016* (2013.01); *B23K 2101/40* (2018.08)

(58) Field of Classification Search
CPC . H01L 21/67126; H01L 21/50; B23K 1/0016; B23K 2101/40
See application file for complete search history.

(56) References Cited

U.S. PATENT DOCUMENTS 5,672,910 A   9/1997  Majumdar et al.
6,459,566 B1 * 10/2002 Casby .................. A61N 1/375
                                                   361/535
(Continued)

FOREIGN PATENT DOCUMENTS

JP        2008166287 A  *  7/2008  ............. H05B 33/04

OTHER PUBLICATIONS

Boyle, et al., "Hermetic Seam Sealing Microelectronic Devices", Amada Miyachi America, online available at <https://amadaweldtech.com/wp-content/uploads/2020/03/Hermetic-Seam-Sealing-Microelectronic-Devices-_customer-reference-copy.pdf>, 2019, 45 pages.

(Continued)

*Primary Examiner* — Mohammed Shamsuzzaman
(74) *Attorney, Agent, or Firm* — Condo Roccia Koptiw LLP

(57) ABSTRACT

A scaling system is described using parameters. The system may obtain input data comprising one or more of a set of package parameters, a set of cover parameters, a set of seal ring parameters, or a set of power parameters. The system may, based at least on the set of cover parameters and the set of package parameters, accurately place the cover on top of the package. The system may use the vision data for programming of the seal operation. The system may apply a force to electrodes and apply a power pulse to the cover and the package to create a hermetic seal. The system may enables change from one package type to another with only one PC program change.

13 Claims, 10 Drawing Sheets

(56) References Cited

U.S. PATENT DOCUMENTS

2002/0175204 A1* 11/2002 Nakazawa ............. B23K 1/008
                                                         228/6.1
2007/0075503 A1    4/2007 Hayashi et al.
2012/0015457 A1*  1/2012 Rawlinson ............. H01L 24/75
                                                       257/E21.53
2021/0028766 A1*  1/2021 Hurwitz ................. H01L 24/13

OTHER PUBLICATIONS

Ilgenfritz, et al., "Advanced Interconnection and Packaging Techniques for Integrated Circuits", Research and Development Technical Report,, 1970, 100 pages.
Szostak, et al., "Hermetic Chip-scale Packaging Using Au:sn Eutectic Bonding for Implantable Devices", Journal of Micromechanics and Microengineering, vol. 21, No. 095003, 2021, 13 pages.

* cited by examiner

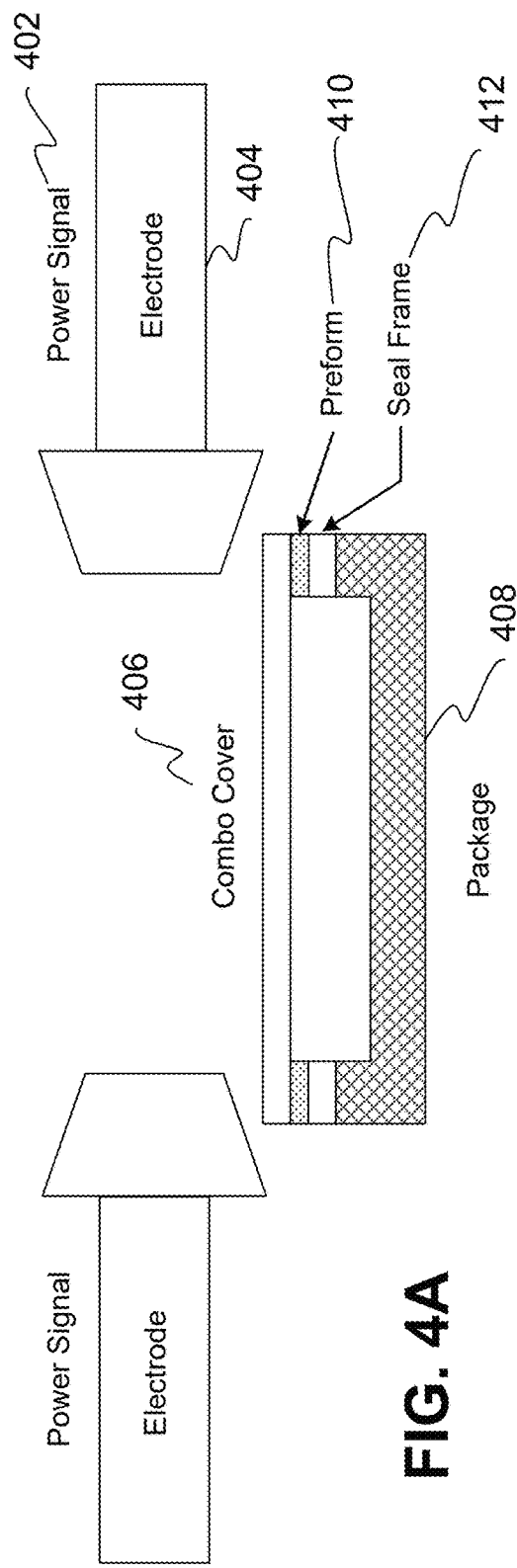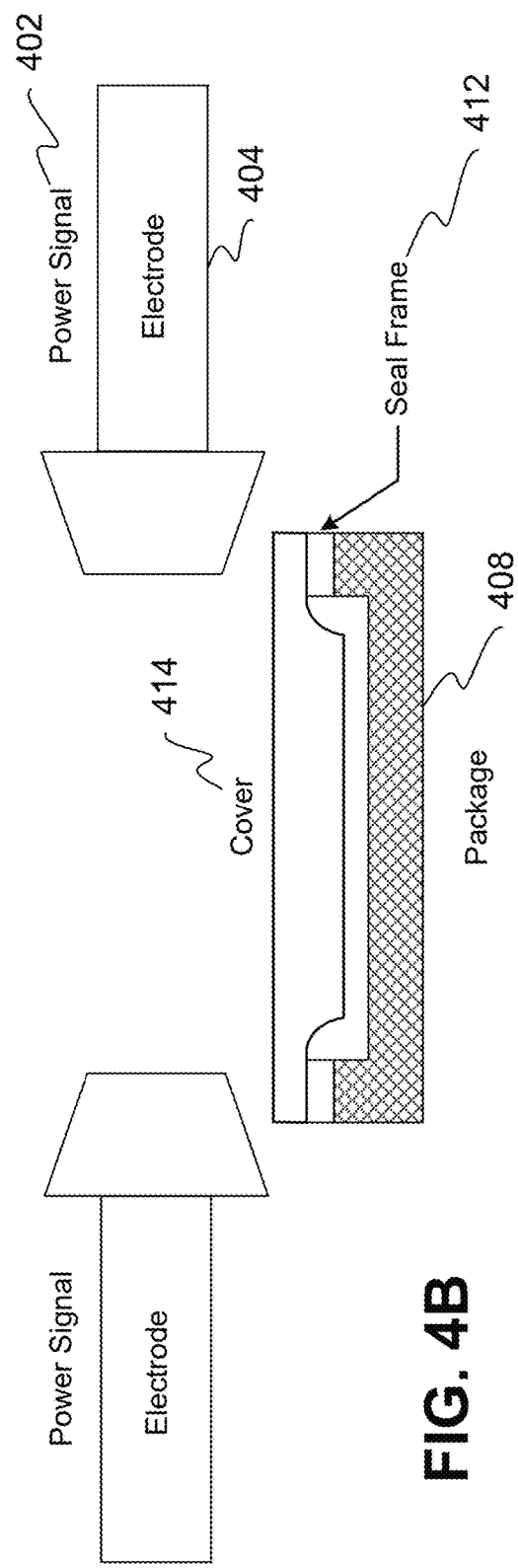

CONTINUED ON FIG. 7B

MicroCircuit Laboratories

POWERED BY BECKHOFF

X-AXIS  X1 Corner
        X2 Corner

| | |
|---|---|
| 2000 | FIRST PULSE SQUEEZE TIME, msec |
| 2000 | LAST PULSE HOLD TIME, msec |
| 2.0 | ROLLBACK DISTANCE, mm |
| 1.0 | ROLLBACK SPEED, mm/sec |
| -0.000 | X2 OFFSET X, mm |
| 0.021 | X2 OFFSET Y, mm |
| 0.000 | X2 OFFSET THETA, deg |

| | |
|---|---|
| 0.125 | X2 OVERLAP, mm |
| 0.250 | POWER PULSE PITCH-X2, MM |
| 25 | TOTAL WELDS-X2 |
| 3.00 | TABLE SPEED, mm/sec |
| 0.3 | TIME BETWEEN WELD, msec |
| 0.20 | EDGE DETECTION FORCE, N |
| 10 | MINIMUM WELD FORCE, N |
| 0.400 | WELD END DISTANCE FROM CORNER, mm |

TEACH HEIGHT

☐ USE MAGNET WHEN SEALING
☑ USE HOLD DOWN PACKAGE

[RUN] [SETUP] [VISION COVER] [TACK] [Y-1 SEAL] [Y-2 SEAL] [X-1 SEAL] [ROTARY SEAL] [MAINT] [ADMIN HELP] [MANUAL MOTOR]

FIG. 7A

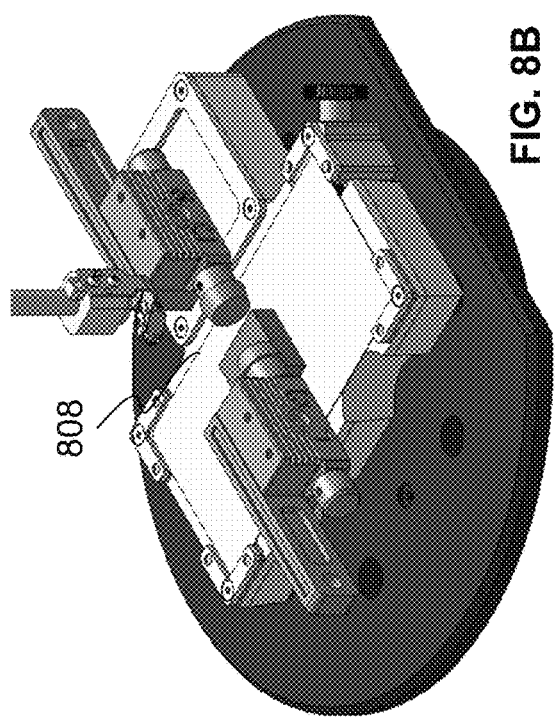
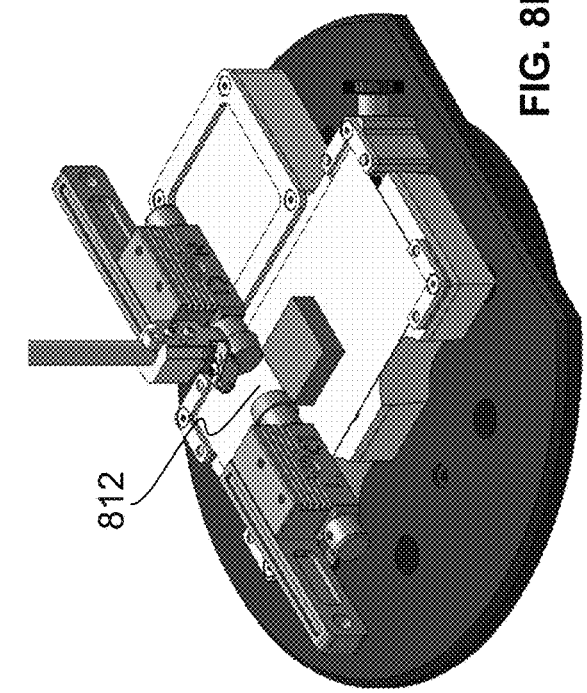
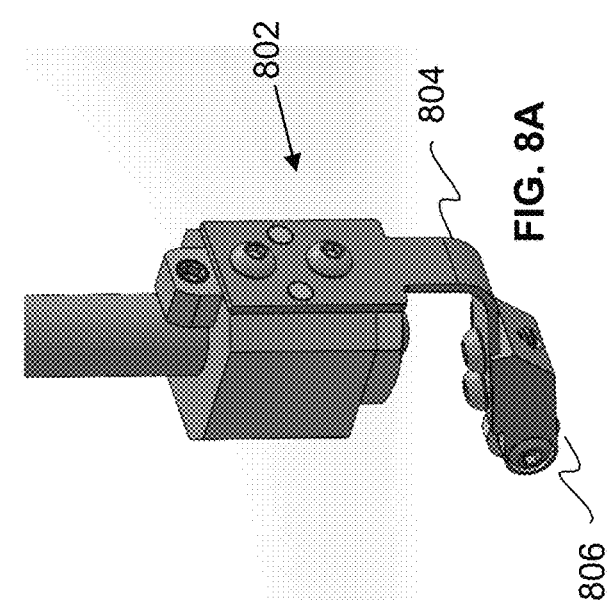
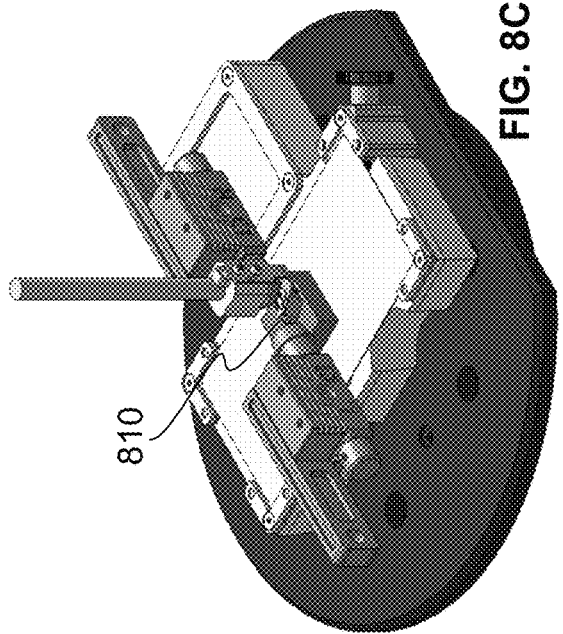
FIG. 8A
FIG. 8B
FIG. 8C
FIG. 8D

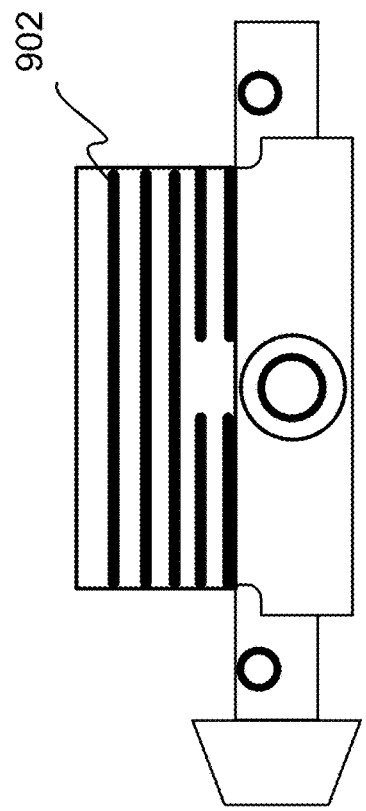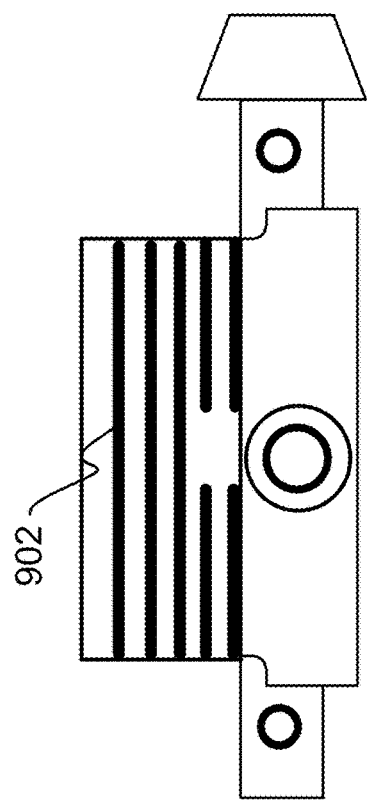
FIG. 9

ROBOTIC COVER SEALER

CROSS REFERENCE TO RELATED APPLICATIONS

This application is the National Stage Entry under 35 U.S.C. § 371 of Patent Cooperation Treaty Application No. PCT/US2024/022537, filed Apr. 1, 2024, which claims the benefit of U.S. Provisional Patent Application No. 63/456,354 filed on Mar. 31, 2023, the contents of which are hereby incorporated by reference herein.

BACKGROUND

Packaging of integrated circuits, which may include, for example, one or more semi conductors, compound semiconductors, integrated circuits, micro-electro-mechanical systems (MEMS), capacitors, circuit board, capacitor, glass, optical, electronic, opto-electronic, mechanical, or electro-mechanical components, typically requires that the package be hermetically sealed to prevent contaminants such as moisture, solvents, or air from interfering with operation of the components or altering the internal environment of the hermetic package. Current techniques utilized for assembling such packages may be error prone, unreliable, time consuming, expensive, and inefficient. For example, in some of the current hermetic packaging techniques, significant manual intervention may be required to place cover on package, adjustment to covers placed on package, adjusting or holding down package and cover during sealing, placing and tacking the lid on a separate machine with electrodes, utilizing two sets of tooling, etc. Such interventions may result in gaps or misalignment between components resulting in subpar sealing quality and compromising the structural integrity and reliability of the final product. Such techniques, therefore, may be time-consuming, inefficient and provide high probability of scrap and a weaker seal joint. For example, switching between various packaging types and packaging tools used during the hermetic packaging process may be inefficient and may induce variations in alignment. Adjusting more than a PC program introduces the human interaction for setup for different packages, while in manufacturing, which can lead to defects. Such variations (even minor variations) in alignment may result in unacceptable product deviations and increased reject rates. Such techniques, therefore, may be time-consuming and inefficient. For example, manufacturers using this product may benefit from hi-reliability for aerospace, defense, communications, medical and other critical microelectronic requirements. Manufacturers that change the package with size, materials, and configurations may be different. In relying on multiple adjustments/programming for changing product, intervention with a human may result in changes to the process and result in scrap or poor performance and rejection. Microelectronic devices may be designed to last 50-100 years, such as for defense systems, and latent defects may be avoided. For example, switching between various packaging types used during the hermetic packaging process may be inefficient. Manual intervention may also result in a significant number of errors and may, therefore, be time-consuming and expensive. Accordingly, it is desirable to develop enhanced hermetic packaging systems that may be more efficient and fully automatic.

SUMMARY

As described herein, a hermetic sealing system (e.g., robotic hermetic system (RHS)) for packages (e.g., microelectronic packages) may facilitate achieving consistent, precision seals associated with long-term reliability of microelectronic devices. The hermetic sealing system may obtain (e.g., receive) data (e.g., input data) associated with many aspects of one or more components associated with a packaging task.

The input data may include one or more of a set of package parameters associated with a package, a set of cover parameters associated with a cover, a set of seal ring parameters associated with a seal ring, set of power parameters, set of electrode parameters, set of tooling parameters (e.g., hold down tooling parameters). The set of package parameters may include a set of package/assembly dimensions including seal ring and other surfaces to be attached to a cover, a package type, package geometric changes, etc. The set of package dimensions may include one or more of a set of package height dimensions, a set of package width dimensions, or a set of package length dimensions, wherein the set of cover parameters comprises a set of cover dimensions, wherein the set of cover dimensions comprises a type of cover comprises one or more of a cover height, a cover width, a cover seal flange, seal flange radius or a cover length, and wherein the set of seal ring parameters comprises a seal ring height, a seal ring length, seal ring arc, seal ring width, a seal ring corner radius, etc. The input data may further include a stage height, block height, tool height, a first pulse squeeze time, a last pulse hold time, a rollback distance (e.g., with a hold down feature, a rollback function may or may not be applicable. The hold down may eliminate rollback, as the hold down may keep a package seated. A DC/AC power supply may eliminate an electrode sticking, so a rollback function may or may not be applicable). A rollback speed, a set of offsets (e.g., on a mechanical axis), an overlap, an overlap program, Pitch Program, a corner overlap, power pulse pitch, a number of welds, a duration between welds, an edge detection force, a minimum weld force and a weld end distance from a corner, wherein the offsets are based on a seal type, wherein the seal type is one of an X1 seal, an X2 seal, a Y1 seal or a Y2 seal or a rotary perimeter seal.

The input data may further include, for example, one or more package parameters. The package parameters may be associated with a package, a set of cover parameters associated with a cover, a set of seal ring parameters associated with a seal ring, or a set of power parameters. The system may include a graphical user interface (GUI) for facilitating seal operations. The GUI may display programmable parameters like 'X2 Overlap', 'Power Pulse Pitch', 'Table Speed', "hold down," and parameters for the movement of an axis during a seal operation, which may be associated with configuring the RHS before the sealing operation. The GUI may include an X-Y axis diagram (e.g., or rotary diagram) related to the positioning of the welding or sealing head, along with system status indicators for monitoring and adjusting the process. The system may enable switching between operational modes such as 'Run', 'Setup', 'Vision', and 'Manual Seal'.

The hermetic sealing system, based at least on the set of cover parameters and the set of package parameters, may accurately place the cover on top of the package to be sealed. The vision system may attempt to keep the distance between the edge of the seal ring and edge of the cover equal on all sides. Accurately placing the cover on top of the package to be sealed may include one or more actions, for example, automatically picking the cover, determining the orientation of the cover (for example, determining the cover is not in upside down position), determining the state of the cover (for example, determining if more than one covers are stuck together), placing the cover in place, etc. Accurately placing the cover on the top of the package may further include determining that one or more edges of the cover to edge of the seal ring are equidistant on one or more (e.g., all four) sides of the cover. An inspection may apply after the cover has been placed on the seal ring. If there is an error, the cover may not be tacked welded in place. This may prevent a defect or destruction of the package. The inspection may occur automatically or manually (e.g., the operator may manually judge the inspection and choose to continue or abort.)

The hermetic sealing system may, for example, across operations—tack, seal—occur after lid placement, where the lid placement may be a placement of the lid on the seal ring. There may not be a hold down with a nozzle of the lid while the lid is tacked in place. In examples, a nozzle hold down may be applicable a for lid tack as a magnet may be used to hold down the package. With the magnet force, the nozzle which places the lid onto the package may hold the lid/tack in place while tacking.

The magnet may be associated with sealing, keeping a package in the tool by a magnetic hold down of the package or a magnetic hold down with the lid on top of package (e.g., when the package is not magnetic).

For packages, for example, smaller packages, the programmable magnet system may enable the cover to be placed, inspected and then tacked. The programmable magnet system may enable the package with the tacked lid to stay in place during the cover seal operation. The programmable magnet may be turned off at the cover pick and place, cover tack operation, and turned on for the seal operation, keeping the package in the tool with either a magnetic package or magnetic cover/lid. By keeping the magnet off during cover seal, the accuracy of the seal operation may be improved and consistent from package to package. By keeping the magnet off during cover seal, the accuracy of the seal operation may be improved and consistent across packages to be placed, inspected, and tacked. The magnet may be raised, so that the package is held down by the force of the magnet on either the package or cover. On some packages, for example, the magnetic cover may hold down the package from the force of the magnet The hermetic cover sealing system may determine when materials are not loaded correctly and prevent operation. This may include an upside down cover, two covers which are stuck together, and a package misplaced in the tool or on sealer stage. The errors of loaded materials may prevent sealer operation and prevents the creation of ruined packages at seal step (e.g., prevent scrap)

The hermetic sealing system may determine that a clearance condition associated with the package and the cover is satisfied based on the obtained input data. A vision system may be utilized for determining the clearance condition associated with the package and the cover. The vision system may include one or more sensing devices (e.g., cameras). Determining that the clearance condition is satisfied may include determining that one of the cover parameters is within a tolerance value (e.g., a predetermined or programmed tolerance value). Determining that the clearance condition is satisfied may include a determination that the cover is not overhanging.

The hermetic sealing system, based on the clearance condition being satisfied, may further determine a height associated with each of a set of electrodes that are capable of moving together (e.g., moving in unison) along an axis (e.g., z-axis). The height associated with the electrode may be adjusted based on one or more of the set of cover parameters or the set of package parameters. The height may be adjusted in order to aim for a good contact for proper subsequent application of force. The hermetic sealing system may determine the force to be applied to the cover and the seal ring. The force that will be used may be programmed and verified by an electronic transducer prior to the electrode touching the cover/seal ring. Force (e.g., most force) may be the result of servo of electrode pressure on cover. In some examples, the force may be calculated based on one or more of the input parameters, for example, an edge detection force or a minimum weld force. The edge detection force may be controlled (e.g., precisely controlled) and programmed as part of the sealing process, for example, when the electrodes roll down the end of the package. The value of the edge detection force may be predetermined (e.g., 0.2 Newtons). To achieve a desired value, a sensor (e.g., a transducer) may be utilized to realize or measure the amount of force applied by an electrode before the electrode touches the package, as opposed to adjusting and creating the force as part of touching the package. The setting of the electrode force may occur before contact to provides (e.g., the most) precision force control. The seal may not occur, for example, unless this condition is met at the start of the operation and throughout. In an example, the hermetic sealing system may robotically obtain the input data, determine that the clearance condition is satisfied, determine the height associated with the electrode, and apply the force to the cover and the seal ring based on the force parameters, as discussed herein.

In examples, vision data may be used, such that an edge of the seal ring may be determined, and such that the edge of the package may be known. The electrode may touch the edge of the seal ring/package, so the electrode may roll up onto the cover/seal ring edge and begin sealing.

The hermetic sealing system based on the determination that the clearance condition associated with the package and the cover is satisfied, both automatically or with user confirmation from digital inspection, may then tack the cover to the seal ring. The tacking may be performed such that the cover is restricted from movement. If a lid is not correctly placed on the package and then tacked, this may result in a seal failure. This results in costly rework, which may ruin the package, introduce metal particles, and damage the interior devices and structures inside of the package. The RHS may perform lid placement inspection, to confirm automatically or by an operator, that the lid is placed correctly. The lid may be tacked securely in place, prior to post tack inspection or the cover seal process The inspection of cover placement may occur before tacking. In examples, the hermetic sealing system may inspect the placement of the cover using the vision system, for example.

The hermetic sealing system may seal the cover to the package, for example, by applying heat and force. The heat may be generated by the flow of electrical current between two electrode rollers. The point of contact of each electrode may be the location where the electrode touches the cover on top of a package seal ring. The electrodes may be low resistance, and the cover may be high resistance, such that with Ohm's law, the contact resistance generates a heat (e.g., a quick/very quick amount of heat). The force may make sure the overlapping surfaces are in intimate contact and that the power density is even. The power pulse applied may be generated based on one or more of the power parameters, which may include power pulse pitch, number of total welds, an overlap (e.g., X1, X2, Y1, or Y2 overlap), table speed, etc. The hermetic sealing system may utilize a DC power control system with an AC weld transformer. Using such a combination and configuration of a DC power control system with an AC weld transformer may be used for providing precise power control and rapid turn off. The generation of the power pulse may utilize a DC power pulse control for operation and using AC weld transformer for rapid response (for example, to achieve rapid upslope and downslope; rapid release for no electrode sticking)

The hermetic sealing system may include performing seam welding to hermetically seal the cover to the package. After the cover has been tacked, the data from the vision system may be used for a cover pick and place on seal ring, and may be used to control the final dimensions of the Seam Weld/Solder joining of cover to seal ring. This may provide precise mechanical control for fine control over pitch distance. The vision data identifying corner may enable the precise program of the last weld to edge of corner distance. Vision data may be provided for the seal ring and a final seal ring (e.g., final seal ring parameters) on a package. Example systems may be associated with human interaction to program this amount. This may be problematic as if the package moves in the tooling for instance, the machine may not realize that the distance from the edge as changed. The hermetic sealing system may collect the position/dimensions associated with the package using the data from vision processing of package seal ring data and cover data, and may be dynamically adjusted in real-time based on feedback obtained from the vision system. Such adjustments may enable an integrity of the seal by maintaining uniform distances from the edges of the package during the sealing process for precise control over weld overlap at corners and weld overlap ay any position on the package, which may enable a balanced and precise hermetic seal. The vision system interface may display measurements of a package and its edges, aiding in the precise placement of the cover relative to the seal ring.

Based on determining the height associated with the electrode, the hermetic sealing system may position a hold down to engage with the cover. The hermetic sealing system may seal the cover to the package. wherein the hold down position remains engaged with the cover when the cover is sealed to the package.

BRIEF DESCRIPTION OF THE DRAWINGS

FIGS. 4A and 4B illustrate examples of a power signal and an electrode that are used in association with hermetically sealing a cover to a package and an example vision camera.

FIGS. 7A and 7B illustrate a graphical user interface (GUI) for a seal operation using an RHS.

FIG. 8A illustrates a hold down mechanism 802, such as a top hold down.

FIG. 8B illustrates the RHS at a time (e.g., t=1), where the electrode may, for example, be brought in proximity to the cover.

FIG. 8C illustrates the RHS at a time (e.g., t=2), where the RHS may, for example, execute the sealing process.

FIG. 8D illustrates the RHS at a time (e.g., t=3), where, at 812, the RHS may, for example, retract the hold down away from the cover following the sealing process.

FIG. 9 illustrates an example cooling mechanism with fins attached to the electrode.

DETAILED DESCRIPTION

Systems and methods associated with an automatic and/or robotic sealing system including, for example, a hermetic sealing system or a robotic hermetic sealing system may provide one or more of the following: (1) ease of loading/unloading packages and/or covers; (2) setup of aspects of system including vision system, seal robotic, power supply, power monitors, etc.; (3) determining whether correct parts (e.g., package type and/or the corresponding cover) are used; (4) enabling intimate contact between the package and the cover being welded: (5) providing consistent force, electrical power, movement in X, Y or theta axis; or (6) providing a clear line of sight of the welding site. The terms robotic cover sealer (RCS), robotic hermetic system (RHS), hermetic sealing system (HSS), and sealing system (SS) are used interchangeably herein. The terms cover and lid are used interchangeably herein. Sealing a package and sealing a package with a seal ring may be used interchangeably herein.

A robotic hermetic sealing system may facilitate automatic and/or manual efficient loading and unloading of the packages and the covers used for sealing the packages. Such efficient loading and/or unloading may be utilized in various industries, for example, medical devices, automotive, aerospace, electrical vehicles (EVs), where precision and speed are vital. A robotic hermetic system that provides easy, consistent, fast, and precise mechanisms for manually or automatically loading and unloading may provide an efficient packaging system that may facilitate high production throughput and less waste.

Figure 1:
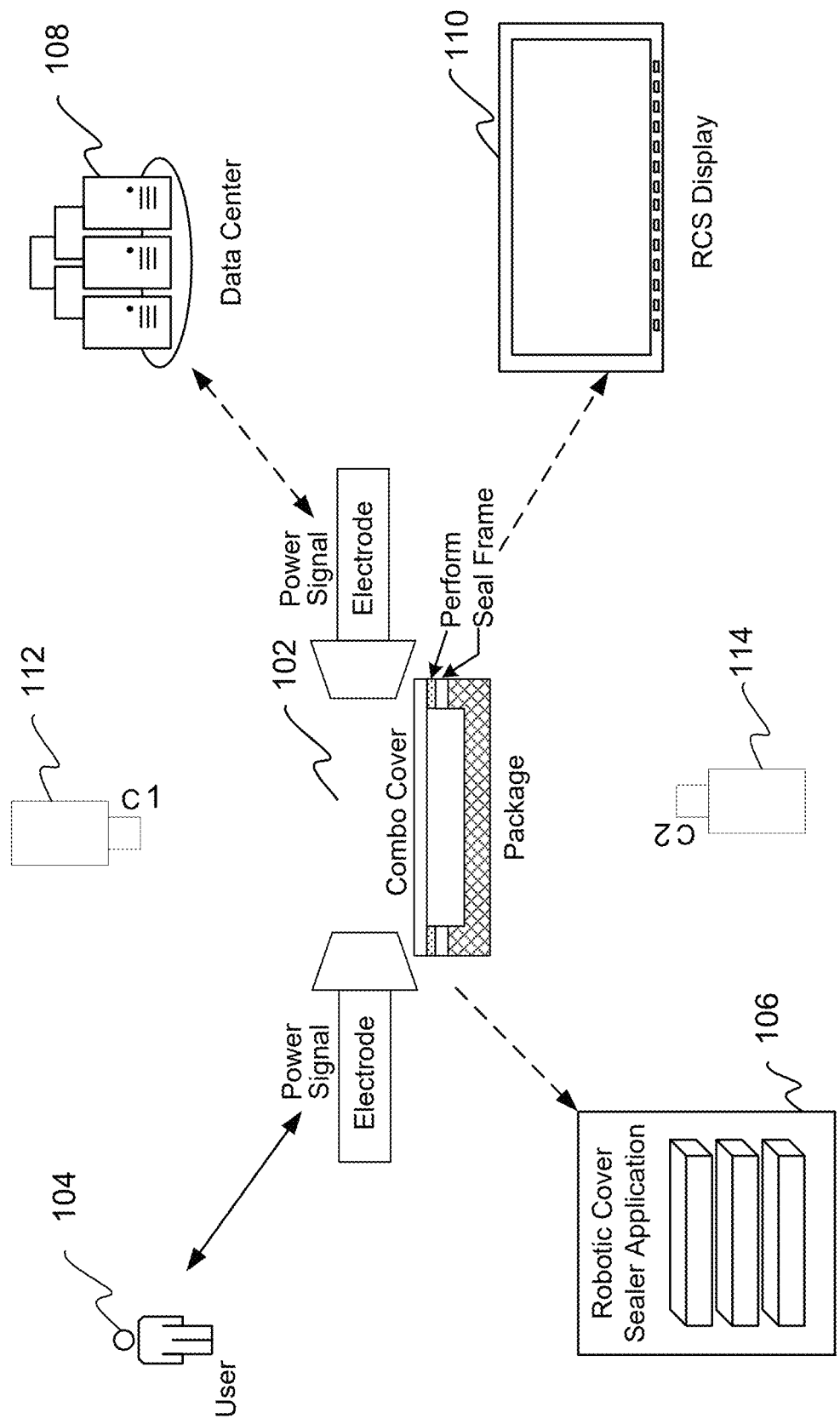
FIG. 1 illustrates an example system diagram associated with a robotic hermetic system (RHS).

FIG. 1 illustrates an example system diagram associated with a robotic hermetic system and its interaction with users and data management infrastructure.

In examples, the RHS 102 enables the sealing of electronic (e.g., microelectronic) packages. The robotic cover sealer may be equipped with power signal electrodes and may interfaces with the package positioned within the perform seal frame. The flow of electricity (e.g., a power) and a force may be applied through the electrodes to create a hermetic seal on the package by seam welding and/or soldering.

A user 104 may include an operator or technician, who may interact with the RHS, for example. The user may initiate sealing operations, monitoring progress, and responding to system alerts. The user interaction may occur through a control interface, which may be a part of the RHS or a separate control panel, such as the RHS display 110. The user 104 may interact with the display 110 to switch between different packages.

In examples, a robotic cover sealer application 106 may include a software application that facilitates the user's control and monitoring of the RHS. The software application may, for example, reside on a local computing system or on a remote computing system that may be accessible via a network (for example, a private network or via internet). The software application may, for example, serve as the communication bridge between the user and the RHS, providing an interface for inputting operational parameters, starting and stopping the sealing process, receiving alerts (e.g., audible alerts and/or visual alerts) and managing system settings.

In an example, a data center 108 may include the system's connection to a data management facility, which may house servers and databases for storing operational data, data associated with various packages and lids/covers (e.g., dimensions and other specifications), system logs, and/or predictive maintenance algorithms. The data center may, for example, be associated with collection, analysis, and archival data generated by the RHS during its operations. The data center may support real-time decision-making, quality assurance, and debugging. In an example, the data center and the computing system hosting the application may be collocated.

The RHS Display 110 may include an output display module that provides real-time audio and/or visual feedback on the RHS operations. The display module may, for example, be part of a larger control system, including statistics like current sealing parameters, system status, and alarms. The display may, for example, act as an immediate point of reference for the user to determine whether the RHS is operating within prescribed parameters and may offer a direct visualization of the system's status. The display may also provide a visual indication of the progress of the sealing process. The display may, for example, be collocated with the actual system that runs the robotic cover sealer application and performs the sealing. In an example, the display may be located away from the actual system and used as an output device for indicating the progress of the sealing process and or reporting alerts.

The RHS Display 110 may be interfaced by the user 104 with a computer that handles the sealing process within the RHS system. The computer, which may, for example, be integrate into the RHS Display (e.g., a touch screen computer, all-in-one computer, etc.) may serves as a command center, directing mechanical and electrical subsystems, and managing the vision processing associated with the sealing operation.

Verification of component alignment may be achieved, for example, manually or through cameras or other machine-based vision optical systems. A first camera 112 of a vision system may be positioned to face downwards towards the sealing area. The first camera 112 may determine the sealing ring on package location, the measurements of the seal ring, the location of the cover, may determine whether the cover is correct or upside down. The first camera 112 may capture images from above the workspace, enabling the RHS to ascertain the dimensions of the cover, the package, the seal ring before and/or during the sealing process. The first camera 112 of the vision system may be used to find the seal ring. The first camera 112 may be used to verify the correct placement of the cover once it has been picked up by the vacuum nozzle, and to confirm that the cover's orientation is correct and not upside down and/or multiple covers are not stuck together. The first camera 112 may be used to inspect a part associated with the package to determine whether the part is a correct part, for example, for a particular package. The first camera 112 of the vision system may be used to measure dimensions associated with at least one of: the cover, the package, or the seal ring. The first camera 112 may be used to determine whether there is a uniqueness associated with a part. The first camera 112 may be used to confirm whether the alignment of the package, the seal ring, and the cover are proper prior to tacking the cover into place.

A second camera 114 of the vision system may be positioned facing upwards. The second camera 114 may, for example, perform imaging tasks, such as monitoring and measuring the cover outside dimensions Sensors (e.g., including the second camera 114) may assess whether multiple covers are inadvertently stacked or stuck together, which may be associated with confirming that a single cover is processed at a time or that the package is located correctly in the tool and on sealer stage). The camera 112 and light ring may move with the height of the package, so that there is not a need to change focus or aperture on different parts. For camera 112, the light ring may have an additional axis to final tune (e.g., fine tune) the illumination based upon package materials, geometries, package feedthroughs, etc. Any of the cameras 112, 114 may move with a height of a part associated with the RHS assembly, so the cameras may not focus (e.g., may not need to focus) because there may not be aperture changes or adjustments when sealing different packages. The cameras 112, 114 may be any of the following: 2D, 3D, black and white, or color.

The first camera 112 (e.g., a downward facing camera) may be used for one or more of the following operations: finding a package and seal ring on package; measuring the package/seal ring; finding of cover on table; or measuring the cover. The downward looking camera may move with the Z system including electrodes, and the view of package/seal ring is associated with a PC program. In examples, adjustments may not occur in association with an aperture, focus, lighting, or changes from one package type to another. In examples, the second camera 114 (e.g., an upward camera) may be used for measuring the cover.

During the sealing process, the first camera 112 may, for example, provide real-time visual feedback. By actively imaging the cover and package, the first camera 112 may, for example, adjust position of the mechanical axis based upon actual package mechanics and location in the tooling. With the RHS system, there may be no mechanical contact once the lid has been released and is sitting on the package seal ring. There may be no mechanical touching of the lid or package until after the lid is tacked in place.

After tack, with a hold down feature, the lid/package may be pressed down and held in place after tacking, before any movement of electrodes off the tacked cover, so there may be no movement of the package. The pressure may be provided from the top and the package movement thereafter may not be of significance. With a programmable magnet system, the same operation may occur like a hold down, and a magnet force may be moved to the tacked lid to package prior to release of the electrodes at the tack position. This may prevent the package from moving, so that the vision identified locations of the seal ring can be used to determine the precise dimensional locations of the seal ring as learned from camera 112 inspection. This may be true for both Hold Down and Magnet Hold down—no fixture operation.

precision machined tooling may be utilized, and the magnet may not allow the package to move out of and away from the tooling. There may not be a magnet used to hold package, or a vacuum nozzle to hold down through the lid tacking process. With the RHS, a programmable magnet hold down may be used after tack and keep the package within a precision machined tool. A rotary seal of small packages may work with a magnet hold down. A mechanical up down magnet which may be applicable.

Post-lid placement, the first camera 112 may be used to inspect the package and evaluate the integrity of the lid placement. If the lid placement is good, as determined automatically by the RCS or determined by the operator, the RCS may do the lid tack process. At the lid tack process, there may be no contact of the package until the electrodes touch down on lid, which are squeezed to the package and a power may be turned on to form a tack weld or tack solder which keeps the lid in place for the sealing operation. Once the tack is performed, while the electrodes are still mechanically pushing down the lid, any of a hold down or magnet force may be used to keep the package in place when the electrodes lift up (e.g., such that there is no movement of tacked lid/seal ring/package. This may preserve dimension measurements of downward looking camera. This may prevents movement from the mechanical operation or covers sticking to electrodes. This may enable the captured vision system dimensions of the seal ring to be accurate and provide precision control over each weld/solder seal position of cover onto seal ring. The first camera 112 may inspect the sealed package from above, for example, and capture image (s) to assess the uniformity and completeness of the lid placement and the seal. Visual data associated with the image(s) may be used for quality control, allowing the RHS to verify that the sealing process has been successful and that the hermetic seal meets hermetic sealing specification. The data may indicate whether the cover is placed on seal ring within specification to enable a seal.

Any of the vision cameras 112, 114 may be equipped with a light source for enhancing image capture capabilities for precise alignment and inspection. A laser sensor may, for example, be incorporated into the configuration, providing, for example, confirming there is a cover to pick up, that the packaged is loaded correctly, etc., before the sealing operation begins This may enables material movement by the operator or by a robot with an interlock to prevent error from loading of materials. The laser sensor may also be used in association with a precision measurement, for detecting cover placement, identifying cover orientation, etc.

Figure 2:
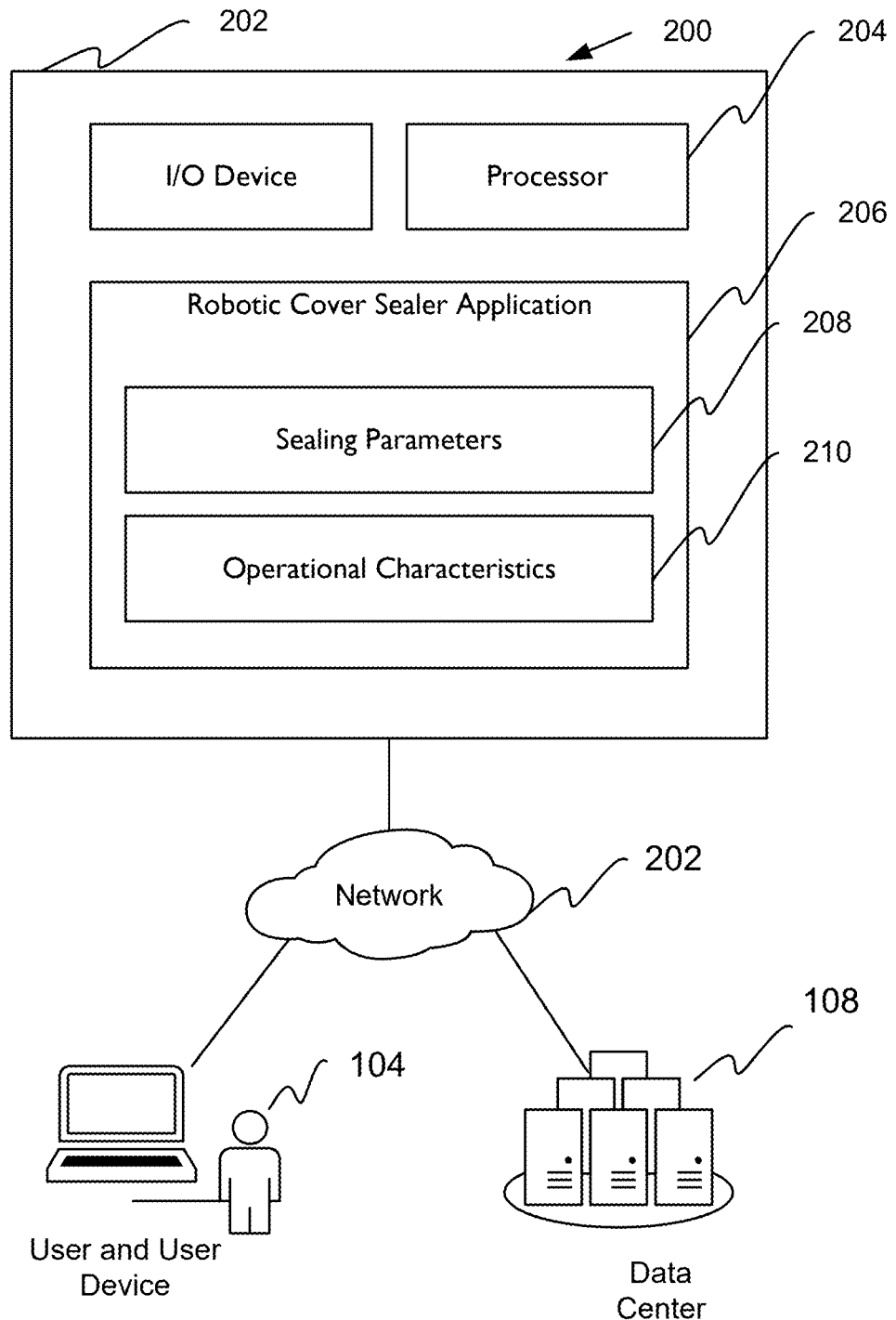
FIG. 2 illustrates an example architecture diagram of an RHS.

FIG. 2 illustrates an example architecture diagram of an RHS, delineating the structural components and their interaction within the network.

In FIG. 2, the processor 204 may include a central computing unit of the RHS. The processor may execute the Robotic Cover Sealer Application 206, which includes, for example, the logic and control algorithms required for the sealing operation. The processor may receive input and deliver output through the I/O) Device, which facilitates interaction with the system's various sensors and actuators, translating electronic signals into physical actions within the sealing mechanism.

The Robotic Cover Sealer Application 206 may include the software that manages the sealing process. The application may utilize sealing parameters 208 to determine the specific conditions under which the sealing is to be executed, such as temperature, pressure, duration of the seal, dimensions of the various covers, seal rings, and packages, etc. The parameters may, for example, be adjustable to accommodate different package and cover combinations, enabling versatility across various product specifications.

The operational characteristics 210 may, for example, provide the system with the ability to monitor and adjust operational aspects such as machine speed, alignment accuracy, and overall system efficiency.

The Network 202 may, for example, establish the RHS's connectivity, linking the processor and the Robotic Cover Sealer Application to external devices and systems. This network may enable data exchange, remote operation, and system monitoring via the user 104 and the data center 108.

The User and User Device 104 may, for example, include an external interface through which the system operator interacts with the RHS. This interaction may include starting and stopping the sealing process, modifying sealing parameters, or reviewing system status and alerts. The user device may, for example, include a dedicated terminal, a portable computer, or a mobile device connected to the RHS through the network.

The Data Center 108 may include, for example, the data management and storage component connected to the RHS via the network. The data center, as described herein, may serve as a repository for operational data, historical records, and for machine learning algorithms that predict maintenance needs and optimize performance associated with the calibration, alignment, and hermetic sealing system. The data center may, for example, be responsible for aggregating data from the RHS system and for analysis and reporting.

Figure 3:
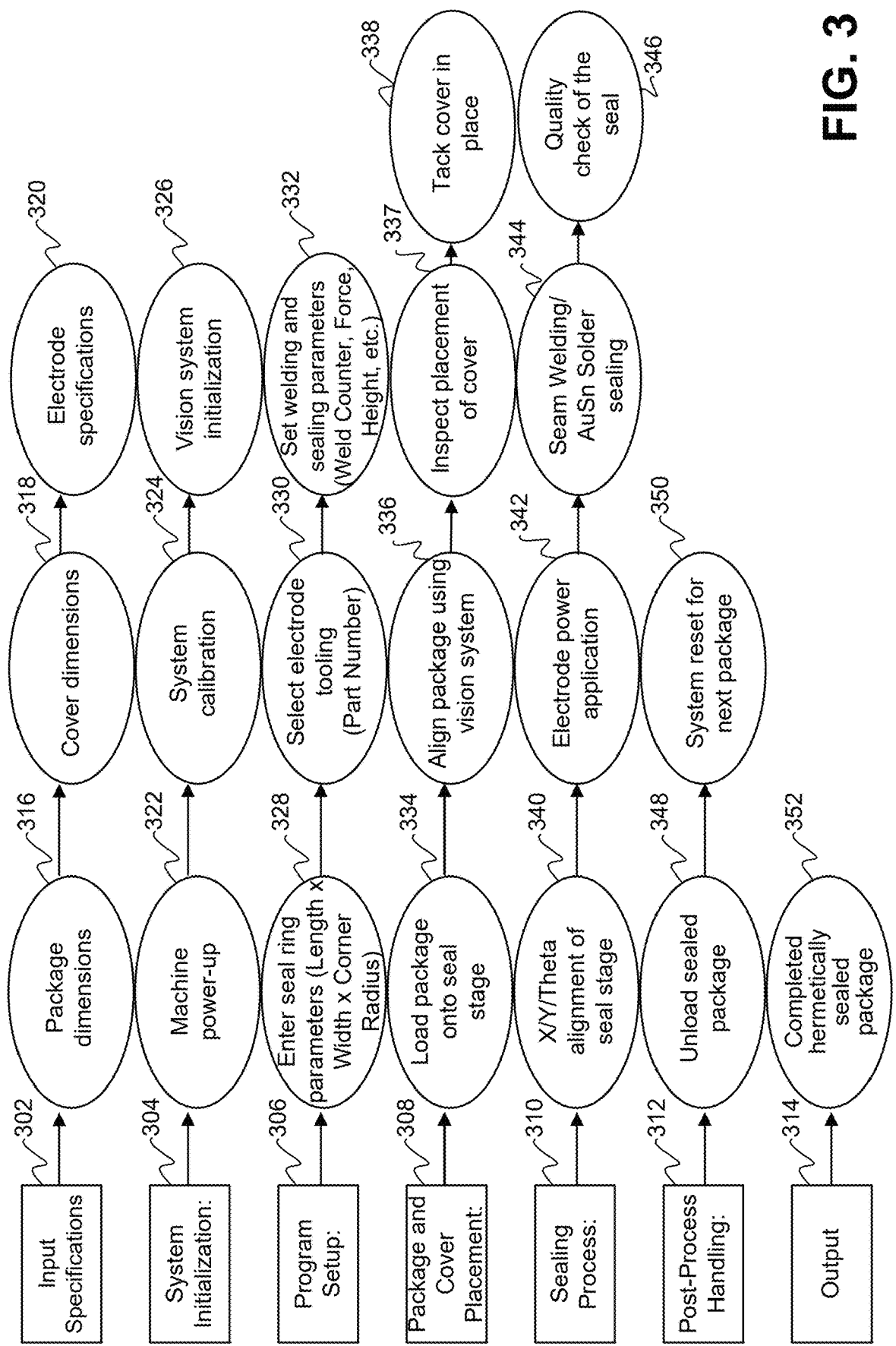
FIG. 3 illustrates an example block diagram for operating a robotic cover sealer.

FIG. 3 illustrates an example block diagram for operating a robotic cover sealer. At 302, the hermetic sealing system may, for example, receive a set of input specifications associated with the sealing operation. The inputs may, for example, include various dimensions of the microelectronic package and cover, such as length, width, and height, along with electrode specifications, tooling heights, and dimensions. The electrode specifications may, for example, include physical and electrical characteristics associated with the sealing process. The input data may, for example, be entered manually by an operator or automatically through a data interface connected to a database or design software where the parameters are pre-stored. The input data may include one or more of a set of package parameters associated with a package, a set of cover parameters associated with a cover, a set of seal ring parameters associated with a seal ring, or a set of power parameters;

In examples, a machine (e.g., a hermetic sealing machine) may be turned on. In examples, a new program may be created. A seal ring length x width x corner radius may be entered. For the width of the seal ring, this may determine the space between the electrodes when sealing the length of the package. For the length of the seal ring, this may determine, for example, the space between the electrodes when sealing the width of the package.

The robotic cover seal programmed width for sealing of side may, for example, be performed by mechanical, electrical and software capabilities, so that the electrodes open and close into position on a unidirectional axis including motor/encoder. This may enable both sides to roll on the same electrode track, which is described herein. Systems may operate with the left and right electrode moving independently, which may make machine up with this up to human programming and judgement. The RHS may have an X, Y, Theta table so that the seal ring can be precisely positioned under the properly spaced electrodes determined by the seal ring dimensions, independent of the package dimensions. Off set seal ring on packages, which may apply for complex microelectronic packages, may be possible with programming of a seal ring and not using special jigs, fixtures, etc., to locate the center of rotation of seal ring in the center of rotation of the sealer. The RCS may center the X Y linear seal so the center of rotation of the seal ring is the center of rotation of the electrodes Cover length x width x corner radius may be entered, for example. If the differing dimensions are not correct, this may change colors to show. The vision system may be programmed for dimensions to work with for operation. The vision processing objective may be both to 1) place the cover so the edge of cover is equal distance from the edge of the seal ring on all 4 sides and determine that 2) the cover does not overhang the seal ring. If determined dimensions are determined to not enable proper operation, an error may be generated, such that a miss seal is avoided (e.g., to avoid the package not being hermetically sealed). The visions system may learn the final exact seal ring dimensions and covers dimensions on one or more package and cover. The changes from package to package, cover to cover, may be captured by the vision system so exact sealing can occur, as programmed, on one or more packages. sealed).

In an example, electrode tooling may be selected by a part number, for example. This may include, for example, all the specific information that is associated with the part number such as electrode angle, width, or outside diameter, etc. A part number for a hold down custom tool end effector may include a width to fit between electrodes based upon the length x and width w of the seal ring and cover.

A purpose may be so this information is correct by the part number. In software, part numbers may, for example, be entered which include this data. MCL may provide the PN and Electrode information. If a user decides to do their own custom electrodes, the user may enter this information.

There may be a weld counter for an electrode. The number of welds may, for example, be programmed to then provide an alert. The user may determine whether to continue or move the welding track to a new position.

The following selections may be made, for example. The power may be turned on or off. With use power when sealing is selected, the machine may use power and weld. Without this, the machine may run through full operations to test. A double weld may be selected. Packages may have a contamination on seal ring. The first seal may remove the contamination, and the second seal may perform the hermetic seal. A complicated package may be selected, for example, which may mean that the seal and lid placement training is to be handled in a more complex way than standard.

At 304, a system initialization procedure may be conducted. The system initialization procedure may, for example, include powering up the system's main controller, initiating self-tests to verify the operational status of all system components, and establishing communication protocols between the system's processor and its peripheral devices such as the vision system and motion controllers. The calibration of sensors and actuators associated with operation may be performed during this stage.

At 306, the system may receive input of seal ring parameters for program setup. The parameters, which may describe the physical dimensions of the seal ring, may be associated, for example, with aligning the sealing elements of the RHS. The program may allow for adjustments to the parameters to accommodate package sizes and shapes, which may be associated with versatility and adaptability of the RHS to different sealing requirements.

At 308, packages and covers may, for example, be placed into the RHS. The placement procedure may include the non-precise positioning of each package onto a designated stage and positioning the non precise position of the cover and arranging the corresponding cover in alignment with the package. This step may, for example, use the vision system and downward looking camera to find the location of the package/seal ring and location of the cover, so these may be known for the pick and place operation. The cover pick and place operation may engage positioning mechanisms that may move and orient the package and cover (e.g., pick up the cover) with accuracy, enabling the sealing area to be correctly prepared for the joining process.

The downward looking camera/light ring may, for example, provide the data to motors so that the cover pickup nozzle is near the center of cover. The vacuum pickup nozzle may pick up the cover. The vacuum nozzle and plumbing is designed, for example, so that the vacuum force will not allow the cover to move.

A vacuum nozzle for hermetic cover sealing may be associated with the metal surface of the vacuum nozzle being precision machined into a metal part which then screws into the barrel of the nozzle. The vacuum nozzle may be precision machined and may screw into a vacuum cylinder. The vacuum nozzle may be precision machined and attach to a pipe which acts as a vacuum reservoir. This may enable precise control and knowledge of pick nozzle length so as not to scratch the surface of the cover or make a mechanical imprint or damage.

The nozzle may move the cover under the upward looking camera/light ring so the vision system captures the dimensions of the cover.

At 310, the sealing process may begin with an alignment phase where the seal stage may be adjusted in XY and theta (rotational) axes to align the package and cover for sealing. The alignment may, for example, be guided by the input specifications and facilitated by the system's vision components. Upon correct alignment, the sealing mechanism may engage, applying a force and heat to create a hermetic seal between the package and the cover. Once the cover and the seal ring have been placed, the vision data collected as described herein may be used to program the machine for sealing. This may include positioning of package for X and Y linear sealing and/or rotary sealing.

Parallel Seam Weld and Seam Solder resistance heating may be applied, for example, to joining metal cover to metal seal ring to form a hermetic seal of a hermetic package including microelectronic and photonic devices. Hermetic may be associated with a package leak rate according to U.S. Mil-STD-883 for Microelectronic Packages, Test Method 1014 Seal, and US MIL STD 750 for Semiconductor Devices for example.

At 312, once the sealing process is completed, the system may, for example, handle post-process objectives. This may include unloading the sealed package from the sealing stage, and the package may be transferred to a cooling station, inspection area, or directly into a storage container. The post-process handling may, for example, enable the integrity of the seal to be maintained as the package cools and transitions to the next phase of production.

At 314, the output phase may, for example, signify the completion of the sealing process for a single package. The RHS may indicate the status of the completed package, for example, logging the process parameters for quality control purposes. The output may, for example, be ready for further processing or packaging, and the system may be prepared to repeat the process for the next package, or the system may enter a standby or shutdown state depending on the production parameters.

At 316, following the input of package dimensions at 302, the system may, for example, obtain details associated with cover dimensions. These dimensions may include the outer measurements of the cover and the tolerances and clearances required for an accurate fit over the package. The cover may, for example, align (e.g., align above a threshold associated with a margin of error) with the package before the sealing process. Misalignment may compromise the hermetic seal. The system may, for example, use the dimensions to determine adjustments and alignments in subsequent stages of the sealing process. The input data may include one or more of a set of package parameters associated with a package, a set of cover parameters associated with a cover, a set of seal ring parameters associated with a seal ring, or a set of power parameters, etc. The set of package parameters comprises a set of package dimensions or a package type, wherein the set of package dimensions comprises one or more of a set of package height dimensions, a set of package width dimensions, or a set of package length dimensions, wherein the set of cover parameters comprises a set of cover dimensions, wherein the set of cover dimensions comprises a type of cover comprises one or more of a cover height, a cover width, or a cover length, and wherein the set of seal ring parameters comprises a seal ring height, a seal ring length, a seal ring corner radius. The input data may further include a tool height, a block height, a first pulse squeeze time, a last pulse hold time, a rollback distance, a rollback speed, a set of offsets, an overlap, a power pulse pitch, a number of welds, a duration between welds, an edge detection force, a minimum weld force and a weld end distance from a corner, wherein the offsets are based on a seal type, wherein the seal type is one of an X1 seal, an X2 seal, a Y1 seal or a Y2 seal. In examples, input data may be used to determine where a corner is (e.g., of the lid and/or the package) and to determine where a power pulse (e.g., the last power pulse) is to be applied. This may keep the distance consistent whether dimensions change in the material dimensions, package on sealer stage, or tooling.

At 318, the system may, for example, address cover dimensions provided for input. This may include the acquisition of precise measurements of the cover intended to hermetically seal the package. The RHS may, for example, utilize the cover dimensions to calibrate and adjust the tooling setup, enabling the cover to be accommodated correctly during the alignment and sealing stages. Cover dimensions may be associated with determining the appropriate positioning of the cover relative to the package and for configuring the motion paths and forces used during the sealing process. The dimensions may, for example, be associated with the vision system to accurately verify that the cover is correctly placed before initiating the hermetic sealing sequence.

At 320, electrode specifications may be obtained. The specifications may include the size, shape, type, height, and material properties of the electrodes that will be used in the sealing process. The system may, for example, use the specifications to set up the welding or soldering parameters, such as electrical current, force, and duration needed to create a hermetic seal. Accurate electrode specifications may be associated with enabling the sealing process to be performed consistently and meet the standards associated with hermetic sealing. The system may, for example, store electrode profiles to be selected according to the package and cover parameters (e.g., dimensions) described herein At 322, power-up activities may take place. This may include energizing the electrical systems of the RHS, initiating boot sequences for software, and engaging servo systems responsible for movement and control of the electrodes, package, seal stage, vision systems, laser sensors, other sensors and more, etc. During the power-up activities, the system may perform a series of checks to verify that power is reaching all subsystems, such that the RHS is ready for precise operation. Power-up activities may, for example, include the activation of the user interface, enabling system monitoring and user interaction for the upcoming sealing process.

At 324, the system may undergo calibration and the dimensions may be set. The dimensions may be determine using a calibrated reticle for distance on every axis. This calibration step may, for example, be associated with enabling measurements and actions taken during the sealing process to be accurate and consistent with the input specifications. The calibration process may, for example, include establishing baseline values for sensor readings, aligning the vision system for image capture, and confirming the precision of actuator movements. Calibration may, for example, enable the system output to match the expected parameters and adapt to variations in package and cover dimensions. The RHS may be calibrated using a precision reticle system on all axes.

At 326, the vision system may be initialized. Initializing the vision system may, for example, include powering up cameras, lighting, and any associated imaging sensors. The vision system may perform self-tests to check the clarity, focus, and field of view of the cameras. The vision system initialization may, for example, enable the vision system to capture detailed images of the package and cover, which may be associated with precise alignment and verification of the sealing process. 326 may, for example, include loading vision algorithms tailored to the characteristics of the materials and components being sealed.

At 328, the system may, for example, prompt for the entry of seal ring parameters. The parameters, which may detail the physical characteristics of the seal ring such as length, width, and corner radius, may be associated with setting up the tooling and aligning the system. The accurate input of these parameters may, for example, be associated with confirming the correct functioning of the sealing process, as parameters may include the spatial configuration of the sealing area may be used to calibrate the vision system for alignment verification.

At 330, the RHS may, for example, select the appropriate electrode tooling, identified by part numbers. This may include choosing electrodes with specifications that match the requirements of the sealing operation, including material compatibility, size, and shape suited to the package and cover being sealed. An electrode part number may correspond to a predefined set of attributes that enable relative performance during the sealing process, such as the ability to apply the correct amount of heat and pressure. The selection process may, for example, achieve a consistent and reliable hermetic seal, as the properties of the electrode may influence the quality of the seal. The system may provide a database or catalog of electrode tooling options, allowing operators or automated systems to select the most appropriate tooling based on the input specifications and requirements of the current sealing task.

At 332, the RHS may progress to setting the welding and sealing parameters for the hermetic sealing process. This may, for example, include configuring parameters such as the weld counter, which tracks the number of welds completed by the system. A force may, for example, determine the pressure applied by the electrodes to the cover and the seal. A height may determine a gap between the electrodes and the package. Adjusting these parameters may, for example, be associated with tailoring the sealing process to the characteristics of the package and cover, such as their materials and dimensions.

When changing the welding track on angled electrodes, as may be seen described with respect to Y1/Y2/X1/X2 or rotary sealing, for a package and for a corner, it may be determined where the last seal pulse will be. As an angled electrode is used, the outside dimensions where the electrodes change as the track position may, for example, be changed. With the teaching of the corner, the new dimensions realized at the particular corner, as realized by the software, may be applied when sealing, as described herein.

Measurements for the total height of the Cover/seal ring to be sealed may be entered, which includes package height, lid height, tool height block height. This may get the heights within range for height teach. When the cover is picked up, this may be a lid bin height. In examples, a teach height may fine tune the height from the data entered. Based on the clearance condition being satisfied, the RHS may the teach height, e.g., a height associated with an electrode. The height associated with the electrode may be adjusted based on one or more of the set of cover parameters or the set of package parameters. The package parameters may include a material type.

It is from this Teach Height that the machine may operate, including application of program force. If the wrong package and cover are loaded onto machine compared to what is programmed, the machine may, for example, stop and provide an alarm. Sealing may not continue which would cause a reject.

At 334, the RHS may, for example, execute the loading of the package onto the seal stage. This may include the placement of the microelectronic package within a designated area on the seal stage, where the package is positioned for the sealing process. The package may, for example, be transported to the seal stage and positioned using a combination of conveyor systems, positioning arms, or other mechanical handling equipment designed for precise movement and placement. Once the package is on the seal stage, alignment mechanisms within the stage may adjust the package's position to confirm that the package is in a designated location for sealing. This may prepare the package for the subsequent application of the cover and the hermetic sealing process. The vision system may identify where the operator places the cover and package, and the RHS may move the cover and package into location for joining and sealing.

For sealing both the long and short side of the cover/seal ring/package, there may, for example, be an additional X axis for the sealer stage, so that the tooling, package, etc., need not be exactly spaced under center. The tool may, for example, place the center line of the package under the center line of electrodes. The electrodes may be controlled by a unison motion, moving the electrodes in and out together. The exact contact position on the electrode may be controlled.

The Seal Stage holding the package may involve X Axis, Y Axis, and/or Theta for pick place heard. The picker nozzle (e.g., a vacuum nozzle) configured to hold a cover may have its own theta and height control (e.g., X/Y axis) from motors associated with the picker nozzle. The seal ring/package/tooling may be moved, as needed, to the center of table, so that the electrodes operate equal distance from center for all operations. If vision is used, this may occur automatically based upon the seal ring within the FOV for one package or by using corners or features of the seal ring or package to align, on larger packages. Optics may, for example, be changed for different fields of view.

At 336, the RHS may, for example, in association with the vision system, align the package on the seal stage. This may include capturing images of the positioned package to analyze its orientation and location relative to predefined sealing coordinates. The vision system may identify markers or features on the package to determine its exact position on the seal stage. If misalignment is detected, the vision system may perform stage adjustments to reposition the package. This realignment may enable the package to be precisely located for sealing The RHS may determine, using a vision system associated with the hermetic sealing system, that a clearance condition associated with the package and the cover is satisfied based on the obtained input data. The RHS may determine that the clearance condition is satisfied based on the RHS determining that one of the cover parameters is within a predetermined tolerance value.

The predetermined tolerance values that the RHS may use to determine the clearance condition between the package and the cover may include specific numerical ranges. These tolerance values, ascertained by the vision system, may be set to allow for a clearance, for example, around the perimeter of the package where the seal is to be applied. The vision system may verify these values against the actual distances measured from the edges of the package to the corresponding edges of the cover. If the measured values fall within the predetermined tolerance range, the system may recognize the alignment as correct for the sealing process.

For large packages where auto pick and place is not used, and covers are manually placed on a seal ring, the vision system may, for example, inspect that the placement is correct, and the cover may be tacked into place. After cover tack, the cover may, for example, be inspected on a seal ring to make sure placement will enable a good seal.

The vision system may inspect the placed lid, prior to the lid tack. This may prevent a defect caused by tacking/welding of lid to seal ring with incorrect fit up—which is out of specification and may cause a defect when testing after seal or creates a latent defect which may result in many years later. Once the lid placement is inspected and correct, the lid may be tacked in place. Once the lid is tacked in place the package is ready for cover seal, the fine tune knowledge of dimensions of the seal ring may be used to fine tune the seal parameters, so they are exactly correct. This may enable precise control over overlap. At corners, a user may program distance from corner to last weld—which may provide overlap at corner control. The vision system may capture the seal ring dimensions and know where the corners are, so that the user may program the distance of the last weld from the corner on each seal. This may provide precise corner weld overlap, which, in examples, may be (e.g., may have been) determined by human eye and is (e.g., may have been) affected by changes in package, tooling, etc., which may lead to poor quality and failures of hermetic seals This may not be dependent on human eye (e.g., may be complete automatically or robotically via the vision system). After tack, the dimensions may be used for the final seal ring and align the seal ring so it is parallel in the X and Y direction for Seam Weld or Seam Solder Cover Seal. Vision data may be provided for the seal ring and a final seal ring (e.g., final seal ring parameters) on a package. In examples, the exact control and distance of the last weld may be known by the vision system and determined by the vision system. For packages sealed in a rotary method, the vision system, during a first package inspection, may, for example, verify it is close or close enough to the center of rotation before starting the process. Within the field of view of the optics of the vision system, there may be no mechanical adjustment, for either the upward looking camera or downward looking camera. Optics may be changed. Features described herein may be associated with a downward looking camera & light ring. A vision system may find a cover on a stage. The vision system may, for example, alarm if a cover is upside down (e.g., using vision system) or stuck together using a laser sensor.

The vision system may, for example, determine dimensions of the lid so that the vacuum pick up nozzle may pick up in the center of the lid. The vision system may, for example, determine a seal ring of package, so that the cover can be accurately placed upon the package (e.g., the seal ring of the package). The vision Placement of the cover may, for example, be based upon keeping the distance from the edge of the lid to edge of the sideline controlled on all 4 sides, so that the distance between the two is uniform as possible on all 4 sides. The height of the Hold Down may, for example, have an additional axis, interchangeable shock absorber, and a wheel. The Hold Down may have its own axis for up/down (hold down control).

At 337, the vision system may be configured to inspect the placement of the cover atop the package prior to tacking the cover into place. The inspection may, for example, include the vision system capturing images to assess the cover's alignment in relation to the seal frame and determining whether the positioning of the cover, package, and/or seal frame conform to set criteria. The system may, for example, evaluate the cover's orientation and determine whether the is aligned within predefined tolerances. Upon confirming that the cover is in proper position, the system may authorize commencement of tacking the cover onto the package (e.g., onto seal ring) A hold down may be used during the tacking process, so that when the electrodes push down and squeeze the lid onto the package, the hold down prevents movement of the package during and after the tack weld process. This may maintain the integrity of the vision data of the seal ring as there may be no position change. In examples, a second inspection, after tack, may be added to verify (e.g., again) that there is no change to package location—data which may be utilized for precise welding. In examples, the cover may become misaligned from the package. It may be difficult to have an exact seal ring dimension for precise position based control. The hold down or magnet system (e.g., the magnetic hold down) may prevent the package from rocking or moving when sealing on opposite side and corner, such that there is no special, machined tool, magnet, etc., to hold package down while sealing the package. The hermetic sealing system may determine that the cover is placed correctly, not upside down or not stuck together. The hermetic sealing system may determine whether the package is sitting correctly on the seal stage or package holding tool. The Vision system and operator may inspect data prior to tacking (e.g., tack weld, tack solder) cover onto package seal ring.

At 338, the system may, for example, tack the cover in place. This may include positioning the cover in a designated location on top of the package in preparation for the tacking and sealing process. The knowledge of package seal ring location may be known for placement of the cover onto the package seal ring. There may be no movement of the package or the cover with RHS precision placement. After placement, the operator or RHS may perform an inspection process. If the inspection passes, the RHS may tack Weld/Solder the lid in place, so that the lid will not move during cover weld/solder sealing. Based on the determination that the clearance condition associated with the package and the cover is satisfied, the RHS may tack the cover to the seal ring, such that the cover is restricted from movement. The RHS may inspect, using the vision system associated with the hermetic sealing system, a placement of the cover based on the tacked cover. The system may determine whether a Hold Down feature (e.g., a mechanical hold down) is to be enabled or disabled.

At 340, the RHS adjusts the X/Y/Theta alignment of the seal stage, confirming the exact positioning and orientation of the package relative to the sealing head and cover placement. The alignment process may, for example, include manipulating the seal stage along three axes: the X-axis for lateral movement, the Y-axis for longitudinal adjustments, and the Theta axis for rotational alignment. The system may, for example, include control algorithms and feedback from the vision system to detect and correct positional discrepancies. The cover may be aligned for a uniform application of sealing processes.

At 342, electrode power may be applied, engaging the electrode tooling. Based on the determination of the height associated with the electrode, the RHS may position the electrode and determine a force to apply, using the electrode, to the cover and a seal ring associated with the package. This may include activating the electrode at locations around the perimeter of the package and cover interface. Controlled electrical current is applied through the electrode, generating a precise amount of heat and associated with the sealing material to melt and bond, without damaging the package contents. The power application may, for example, be regulated during the application of power, with parameters such as current, voltage, and duration calibrated to achieve a seal across the seal area.

The Magnet Package Hold Down may, for example, result in the same operation as the Hold Down. The force may, for example, be coming from below the package and the magnetic force on the package or Cover may keep the Package from moving and rocking during sealing operation.

For a magnet hold down, as programed, a magnet mechanically may be moved up from below the sealing stage to under the tool holding the Package/Seal/Ring Cover. This may keep the magnet in place. A Hold Down from Top on Cover and or Package may, for example, be a mechanical mechanism which moves from the top and will contact the Cover and or Package to keep the package in place while sealing. The Hold Down from Top may hold down the cover/package, so it does not move during the seal operation. The hold down may, for example, be configured with a wheel which rolls upon the cover or package, so that as the cover/package moves for sealing and all operations, while the hold down feature keeps the cover/package from moving. The wheel may be a rotating mechanism. A roller ball or smooth dragging material on top of cover may, for example, be utilized.

With either of the Magnet Hold Down or Hold Down from Top, there may, for example, be no need to use elaborate tooling or fixtures, for instance bolting a hermetic package to the tooling. This may, for example, be common in Photonic applications, such as Lidar, Co-Package Optics, Data Communications, Aerospace, Defense, Sensors and more. Features described herein may be associated with a Hold Down feature. The Z Axis mechanism may control the height, and the Hold Down may have an additional axis. There may be a shock absorber (metal spring), so when the hold down touches the top of the cover for Seam Weld or Seam AuSn Solder, after it has been tacked, the package, for example, will not move during the sealing operation. The Hold Down may, for example, have a wheel (e.g., moving piece) under the shock absorber, so that when the hold down contacts the package, it rotates on the cover and does not drag on the cover, so the package may be held in place during sealing. This may prevent the package from moving, sometimes with or without tooling, and may resolve rocking. The hold down from top or the magnet hold down mechanism may provide fixture free operation enabling the packages to be sealed without using any additional tools.

Rocking may include the electrodes sealing at one corner, and the other corner lifting up. One of the problems this may cause is that the corner with the rocking may not have the electrode wheel apply the power pulse as programmed, as the weld distance may increase, and the point of contact may be lowered. There may, for example, be a weld gap at the corner and the other side rises, so the package can get dislocated in the middle of a sealing process. The package may be dislocated out of the tool so that on subsequent operations there is a failure do to the packages' new location. Without this feature, there may be fixtures or tools which hold the tool in place. For example, LiDAR photonic packages may be bolted to a tool that goes through the cover seal process.

At 344, the system may execute the seam welding process. The RHS may seal the cover to the package using the determined force to apply to the cover and the seal ring associated with the package. The RHS may seal the cover to the package by applying a power pulse based on one or more of the set of power parameters. For seam welding, a continuous bond may, for example, be formed along the seam where the package and cover meet, utilizing the heat generated by the electrode power application to create a weld that hermetically seals the package. The process, for example, is automated, with the system controlling the movement of the electrode to enable a consistent seal along the entire perimeter of the package.

The Teach Height Feature may, for example, establish contact and then lower a set amount to make sure there is (e.g., good) contact for proper force application. Force may, for example, be a process factor in the Resistance Seam Weld/AuSn Hermetic Cover Seal. A Teach Force may be used to teach the force applicable in the welding process.

Seam sealing may, for example, include four processes. A process may, for example, include cleaning inside the package by heating and vacuuming the package. A process may include tack welding a lid on the package. A process may, for example, include welding Y sides and X sides of a package, which may complete the process. In a vacuum heating process, packages may be placed in a box called the vacuum oven chamber. Prior to sealing the package inside, the package may be cleaned by vacuum and heat for better operating environment for the devices inside after ceiling. Heating and vacuuming, for example, may help evaporation and any moisture oxygen or solvent existing inside the package may be removed. In a track welding process, a spot on the lid and the package may be welded in advance, so that the lid does not move while the roller electrode rolls along the rim of the lid. In a seam sealing process, Y sides may be welded (e.g., first), and (e.g., next) X sides, for example, may be welded. When all the circumferences are welded, sealing may be completed. There may be multiple (e.g., two) ways of doing seam sealing (e.g., N2 environment and vacuum). N2 or vacuum may, for example, be the environment inside the package after sealing, which may help maintain a favorable operating environment for the devices inside. Vacuum may, for example, be used more due to its advantage for smaller size and higher performance of devices.

At 346, a quality check of the seal, for example, is performed. This may include inspections and tests to verify the seal's integrity, uniformity, and adherence to hermeticity standards. Visual inspections may, for example, be supplemented with automated imaging techniques to identify physical defects or irregularities in the seal. Testing methods may be used to detect minute leaks or breaches in the seal that may compromise the package's hermeticity. The results of the quality checks may, for example, be meticulously documented, with a package receiving a pass or fail based on whether it meets the established criteria for a hermetic seal.

At 348, the RHS may, for example, engage in unloading the sealed package from the sealing stage. This may, for example, include the mechanical removal of the package that is securely sealed from its position on the seal stage. Depending on the system's configuration, this may be facilitated by robotic arms, conveyor systems, or other automated material handling equipment designed to move the package to prevent a disturbance to the newly formed hermetic seal.

At 350, the RHS may, for example, initiate a system reset to prepare for the sealing of the next package. This may include clearing the seal stage of any remnants from the previous sealing operation, re-calibrating sensors and alignment mechanism, and resetting the sealing parameters to default or to the specifications of the next package to be processed The vision system may undergo recalibration for the upcoming operation (e.g., an upcoming sealing).

FIG. 4A illustrates an example of a power signal and an electrode that is used in association with a hermetically sealing (e.g., solder sealing) A solder may be referred to interchangeably as an AuSn Solder. A power signal 402 may, for example, be connected to an electrode 404, which is the means for delivering electrical energy (e.g., a power pulse) necessary for the sealing process. The power signal 402 may, for example, be controlled and modulated to generate the appropriate amount of heat through the electrode 404 when contact is made with the cover 406 for sealing. A cover and a lid may be used interchangeably.

FIG. 4A illustrates an example dual opposing electrode configuration, where an electrical power signal(s) travel from one electrode, through the lid to the other electrode, but additional or less electrode configurations may be conceived. A dual-electrode configuration may be employed for simultaneous or sequential welding to enable a particular integrity and uniformity of the hermetic seal. The electrode may be one of a set of electrodes capable of moving together along an axis, and the RHS may determine and apply a force using the electrode.

The cover 406 may, for example, be positioned above the microelectronic package. The cover may be formulated with materials or coatings compatible with the welding or soldering process and may be designed to conform to the dimensions and contour of the package 408. The package 408 may, for example, include microelectronic components requiring hermetic sealing. The package may be situated beneath the cover 406 and may be ready to be joined through the process facilitated by the electrodes and the power signals.

The preform 410, for example, indicates the specific region where the sealing action is to take place between the cover and the package. The preform 410 may include a preform material, such as a solder preform, which is placed in the gap between the cover and the seal frame to facilitate a hermetic seal when heated. The solder preform may be designed to melt and flow upon the application of heat, creating an impermeable seal that conforms to the shape of the sealing area.

The seal frame 412 may, for example, include the structural boundary on the package that defines the area to be sealed. The seal frame may be integrated into the package design and serve as the contact point for the cover to attach. The seal frame 412 may include a material that is conducive to forming a strong bond with the cover when joined through a welding or soldering process. The seal frame 412 may be coated or plated with a material to modify the bonding process based on the cover or performance material. The frame may be referred to as the seal ring FIG. 4B illustrates an example of a power signal and an electrode that is used in association with hermetically sealing (e.g., weld sealing) a cover to a package. In FIG. 4B, the cover 414 may be attached to the package 408 using the seal frame 412. With a weld seal, the cover may be flat or have an etched seal flange, as depicted in FIG. 4B.

In the welding process depicted in FIG. 4B, the electrode may be controlled to deliver energy to the area where the cover 414 and the seal frame 412 interface. The power signal's parameters, such as amplitude, duration, and waveform, may be tuned to the materials' properties and the specific welding requirements (e.g., the cover 406 may be associated with different power signal parameters than those of the cover 414).

A vision system camera 414, may be a component integrated in association with the RHS. The camera may capture high-resolution images of the package and cover at various stages of the sealing process. The vision system camera 414 may be associated with determining the dimensions of a cover, a sea ring, and/or a package. The vision system camera 414 may be associated with verifying the positioning and alignment of the package, the seal ring, and the cover before, during, and after the sealing operation.

The camera 414 may be strategically positioned to have a clear view of the sealing area, enabling the camera to detect the presence of the cover and package, verify their correct placement, and enable the proper execution of the sealing process. The camera 414 may be equipped with optical components that allow the camera to focus on fine details and capture the nuances necessary for high-precision operations in hermetic sealing.

The images captured by the vision system camera may be processed by the RHS to identify any deviations from the predetermined tolerance values for the alignment of the package and cover. The system may use such information to make real-time adjustments to the alignment or to confirm that the sealing process can proceed. Post-sealing, the vision system camera may also be used to inspect the quality of the seal.

The Seam Weld and Seam AuSn Solder process may, for example, have very localized, fast welding, or solder reflow, so that the contents inside the package have controlled heating according to the electrical and mechanical programming of the machine. Feedthrough of materials including glass, ceramic, metal solder, on both the package sidewalls or bottom and cover may be described herein This process may be used for hi-reliability microelectronics or internal apparatus that require specific headspace (internal atmosphere) requirements.

In a seam weld, the package may, for example, have a metal ring on it, which may range in height and thickness. The heating at the point of contact of electrode to lid/seal ring may create enough heat to result in a weld.

Regarding a seam solder, the preform between cover and seal frame is solder, which may, for example, be an AuSn Solder. The seal frame may be a metallized surface on a package or may be a metal weld ring on package. The heating at the point of contact of electrode to lid/seal ring may create enough heat to result in a weld.

Features described herein may be associated with Engineered Fins for Active Air Cooling of an Electrode. The tooling holding the package may, for example, not be used as a heat sink and aggressive heat sink tooling may not be used. Heat may be driven to the electrodes, which may keep packages cooler and may be used in associated with a hermetic cover seal.

The electrodes may move in and out together. The sealer table may, for example, include theta, X and Y motion together on one unit. The package may not need to be in the dead center of the tool. During Y seal, the X table may be moved left or right to keep cover/seal ring joint equal distant on each side for common electrode contact position. During X seal, the table may rotate 90 degrees, and the X table may be moved left or right to keep cover seal ring joint equal distance.

The package body may, for example, be in a configuration and size. A metal surface, whether metallized or actual metal or similar, may be described herein. The surfaces may be plated. Platings may include Au/Electrolytic Ni; Au/Electroless Ni; Electrolytic Ni and Electroless Ni platings.

Figure 5:
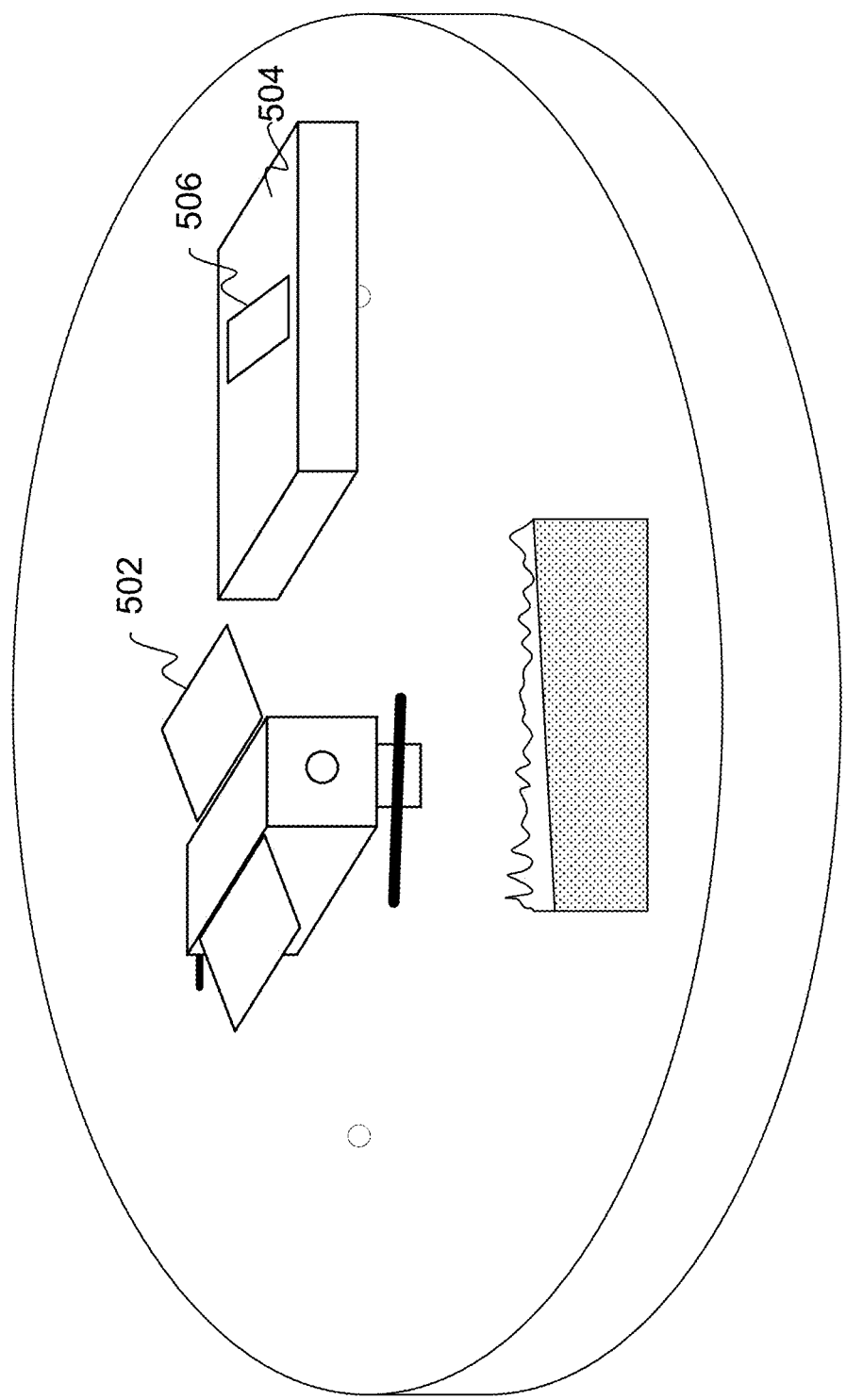
FIG. 5 illustrates an example sealer stage including microelectronic packages that are positioned on a table including the RHS.

FIG. 5 illustrates an example sealer stage including microelectronic packages that are positioned on a table including the RHS which may serve as a platform for the sealing operation. The table may, for example, support the package and the cover during the sealing process. The table may allow for movement and positioning of the package and cover, accommodating the X/Y/Theta adjustments associated with proper alignment. The surface of the table may enable stable placement of the package and cover and may incorporate fixtures or holders that secure the components in place during the sealing process.

Atop the table, the package, which includes the microelectronic devices to be hermetically sealed, may, for example, be positioned. The package may, for example, be central to the sealing operation and may include materials suitable for maintaining the integrity of the microelectronic devices within The placement on the table may suggest preparation for the subsequent sealing with the cover.

Based on at least the obtained data associated with the cover, the seal ring, and the package used, the cover may be placed on the table, in proximity to the package, awaiting alignment and sealing. The cover may, for example, be automatically positioned on the package, protecting the enclosed microelectronic devices. The position of the package, the seal ring, and the cover positioned on the table may be verified before the sealing operation begins.

Figure 6:
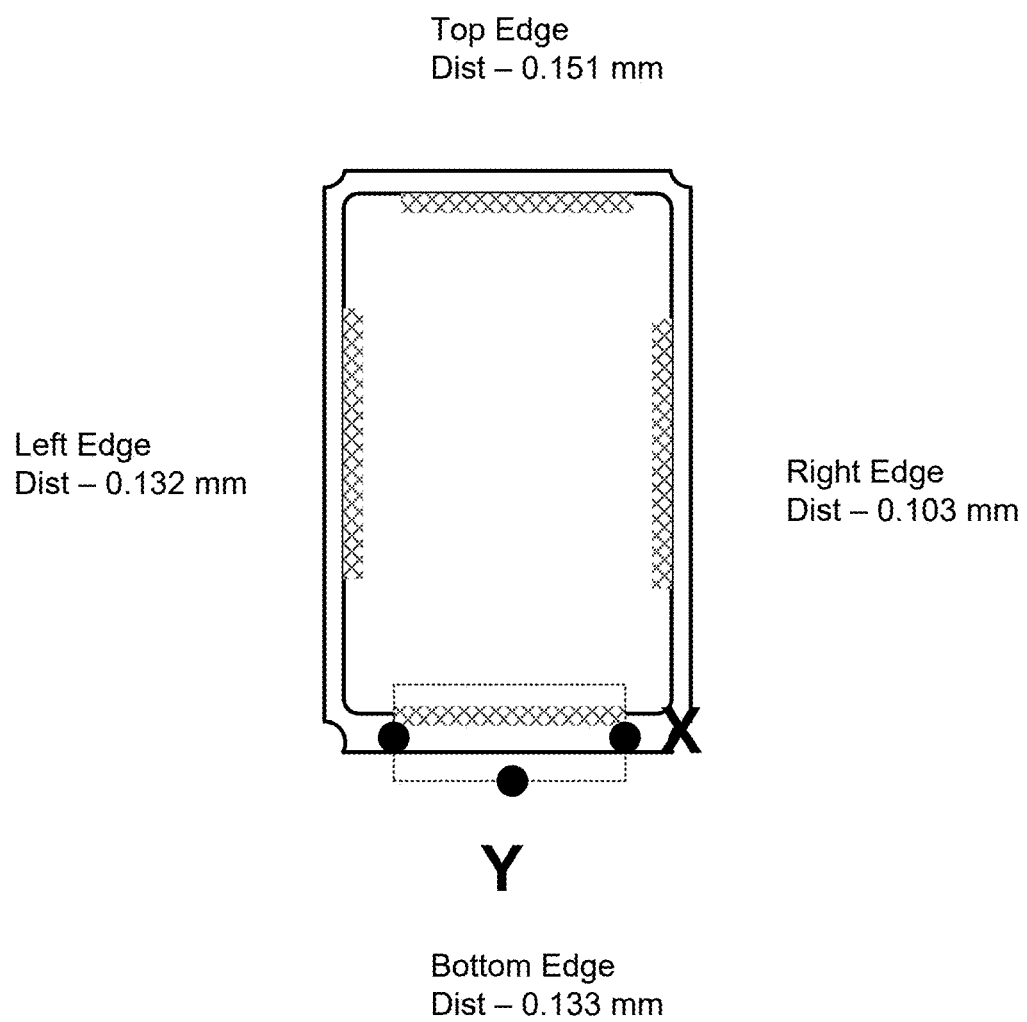
FIG. 6 illustrates an example vision system interface (e.g., showing measurements of a package and edges thereof), where the same vision system interface may be applied to a cover associated with the package.

FIG. 6 illustrates an example vision system interface (e.g., showing measurements of a package and edges thereof), which, for example, displays measurements associated with aligning the cover over the package in preparation for sealing. The interface, for example, illustrates a highlighted perimeter around the cover, with distinct measurement indicators on each side.

The top edge of the cover may be labeled with a distance measurement indicating its alignment relative to a reference point or edge, for example, as indicated in the figure, as 0.151 mm. Similarly, the left edge, right edge, and bottom edge of the cover are indicated with their respective distance measurements from their alignment reference points, for example, as indicated in FIG. 6, 0.132 mm, 0.103 mm, and 0.133 mm, respectively.

Each edge may, for example, have an associated line that corresponds to a measurement guideline provided by the vision system. This overlay may serve as a visual aid for the operator or the automated system to discern the precise alignment of the cover. The annotations 'X' and 'Y' may suggest the vision system's ability to determine deviations along both the horizontal (X-axis) and vertical (Y-axis) planes, enabling accurate placement of the cover over the package.

The consistent distance measurements around the cover may indicate a (e.g., high) level of precision in the alignment. The interface may be associated with operation of the RHS, providing real-time data to facilitate adjustments to the positioning of the cover, thereby enabling the seal to be placed with precision. The measurements presented in the interface may allow for fine calibration and verification of the cover's position before the sealing process begins. For example, FIG. 6 may illustrate an orientation of the cover with respect to the package before or after positioning and alignment of the cover with respect to the package.

FIG. 7A illustrates a graphical user interface (GUI) for a seal operation using an RHS, presenting various controls, status indicators, and parameter settings associated with executing a sealing operation, for example, an X-2 seal, as indicated in FIG. 7A. The GUI may, for example, be organized into several sections, each providing information and control elements that correspond to the different aspects of the sealing process. In examples, a package may be switched with another package with an interface of the GUI. A user may select the package(s).

The left section of the GUI illustrates an interactive control panel labeled "X-AXIS," displaying a schematic representation of the package with the X1 and X2 corners indicated. Below this schematic may include central parameter inputs such as "FIRST PULSE SQUEEZE TIME," "LAST PULSE HOLD TIME," and "ROLLBACK DISTANCE," "ROLLBACK SPEED," "X2 OFFSET X," "X2 OFFSET Y," "X2 OFFSET THETA," "X2 OVERLAP," and "EDGE DETECTION FORCE," "MINIMUM WELD FORCE," etc. The inputs allow the operator to define the timing and motion specifics for the sealing process, with fields for setting offsets in the X and Y directions as well as rotational (Theta) adjustments.

"X2 OVERLAP," "POWER PULSE PITCH-X2," "TOTAL WELDS-X2," "TABLE SPEED," and "TIME BETWEEN WELD," may include numerical inputs that dictate the specifics of the sealing operation. The settings may, for example, adjust how the seal is created, the timing between welds, the overlap of the sealing material, and the speed at which the table moves during the sealing process. Additional parameters like "MINIMUM WELD FORCE" and "WELD END DISTANCE FROM CORNER" may be provided to refine the seal's integrity.

To the right of the central parameters may, for example, include a graphical waveform representing the power signal profile during the sealing operation. The waveform graphically illustrates the different stages of the sealing process, including "Preheat," "Upslope," "Weld," "Downslope 1," "Downslope 2," "Postheat," and "Cool." Adjacent to each stage are numerical inputs for modifying the power and duration of each phase, allowing for a sealing process that may adapt to various material and environmental conditions. The modification may be determined automatically.

The top right of the GUI may, for example, include a "SYSTEM STATUS" section, including an alarm indicator and a readiness status, alongside a "MACHINE STATE" display indicating whether the machine is idle, running, or in another state. The indicators may provide the operator with real-time feedback on the system's current condition.

The bottom of the GUI, for example, presents a series of buttons corresponding to different stages of the sealing process and system operations, such as "RUN," "SETUP," "VISION COVER," "TACK," and switching between the various seals, such as "Y-1 SEAL," "" X-1 SEAL," or "X-2 SEAL," allowing the operator to initiate each stage of the sealing process manually. Additional functional buttons for "ROTARY SEAL," "MAINT" for maintenance, "ADMIN/HELP" for administrative settings or system help, and "MANUAL MOTOR" for manual control of the sealing apparatus may be included.

At the bottom of FIG. 7A, an option to "ENABLE X2" signifies, for example, that the X2 sealing parameters are active, and below this toggle, the current recipe and user logged into the system are displayed, for example, to apply the determined sealing parameters and provide traceability of operations.

In all seal screens, the specific mechanical and electrical parameters may, for example, be individually applied to each of the 4 sides sealing. For the specific Y1 side of the package the user may, for example, adjust the seal ring on package to be in parallel with electrodes. For the specific Y2 side of the package the user may, for example, adjust the seal ring on package to be in parallel with electrodes. For the specific X1 side of the package the user may adjust the seal ring on package to be in parallel with electrodes. For the specific X2 side of the package the user may, for example, adjust the seal ring on package to be in parallel with electrodes. This may be done either in the seal screen or may be selected to do this automatically with vision.

If the seal ring is on a package or substrate which is not square or is on a tool that is not square or on block, it may be aligned to be parallel to the electrodes as they both run down on opposite sides of the package. Whatever the cause, this may, for example, enable the machine by either programming or use of vision may keep the Y1/Y2 Side Cover/Seal (or X1/X2 Side Cover/Seal) parallel to electrode roller or if the user wants to program this not to be parallel, this may be programmed.

The user may, for example, decide whether they want the Seal Ring/package with lid or no lid held into place by Automatic Magnet or Hold Down. The use of Magnet may have a magnet underneath the Package Bottom rise to hold the package/cover in place during the Y1/Y2/X1/X2 Seal operation. The Hold Down will provide an automatic Axis which presses on top of package or Cover with force to keep the Package/Cover from moving while in the seal operation.

Teach Height may, for example, be applied to the Cover on top of the Sealing Ring of Package. The Z axis, which is twin actuators (e.g., which may be known as Twin Towers), may, for example, move both the electrode apparatus up and down, in complete unison movement. There may be minor differences in mechanical tolerances and moves, such as electrode axel movement in an electrode bushing, so that the electrodes are moved into contact of Lid On Top of Seal Ring on top of package and taught the height. The height may be realized by a change of an integrated transducer on each left and right electrode. Once the value is reach, an encoder position, transducer value, the Z is lowered further to assure good contact.

The force feature may, for example, be separate from the height control and may be separate on each left and right electrode so that the force is applied uniformly on both sides of the Cover Seam Weld/Seam AuSn. The Force is described herein with respect to a user interface. The determination of the force to apply to the cover and the seal ring may be based on a preset mechanical/electrical condition with feedback by a calibrated transducer/electronic device, or one or more of an edge detection force or a minimum force. Examples described herein may be associated with a preset force. For example, mechanics may use feedback to determine the amount of force to be applied before the electrode touches the package.

A Minimum Weld Force, N may, for example, be a force which the electrode will apply. The force may, for example, be set on the electrode axis, where the position of the electrode pressure is squeezed against the transducer until the programmed force is realized. Because transducer values move at certain decimal places, the force may be set, so the number is a minimum number per program, and the force value is above this just to prevent it from going below this number in operation.

An Edge Detection Force, N may include a value used to determine when the electrodes roll down the end of the package. As the electrodes roll down the edge of the package, the height contact between the top of cover and electrode may, for example, decrease, which decreases force. The value may be programmed specifically, as there may be wide ranges in the corner radius of both Seal Rings and Covers . . . 2 Newtons may be recommended.

A Weld End Distance From Corner, mm may be determined by the vision data on the package seal ring during lid pick and place process. The user, program, and/or system may maintain a precise distance of the power pulse from the corner. Because a hold down (or Up Magnet) is applied during and/or after tacking, there may be no movement in the package. In examples, a vacuum nozzle may be used to hold down lid and package for tack, which may introduce (e.g., unwanted) movement.

An Edge detection Force, N, may be described herein. The sealer may, for example, look for the edge; it's movement towards the center of the package is the Weld End Distance From Corner. This may be performed on every Y1 Y2 X1 X2 Seal (e.g., and rotary seal). There are several purpose of this. The main purpose is to the positioned of the last Seam Weld/Seam AuSn Cover Seal pulse location is located. This may, for example, provide the last power pulse position, so when the metal is liquified, the length will cover desired amount of cover and seal ring, so there is a gas tight seal in a corner. In an example, the corner edge may be detected based on the dimensions data of the cover, the sealer ring, and/or the package.

A Power Pulse Pitch, mm, may be a distance between power which, when on, provides heat at the electrodes to either hermetic Seam Weld or Seam AuSn seal the cover to a package seal ring. The Total Welds may include (e.g., From the Weld End Distance from Corner and Pitch) the number of Welds where the Seam Weld/AuSn Solder starts. In addition to the corners, this may, for example, be where the Seam Weld/AnSn Solder Joints overlap. The amount of overlap may be determined by the Total Welds On Y1/Y2 (or X1/X2) and how far each moves past center in the opposite direction of travel to corner for each particular X1/X2 (or Y1/Y2 Seal).

The Y1 Overlap, mm may include the center overlap on Y1 based upon the value of Y2, or Y2 based upon the value of Y1. For example, if the number of Power Pulse for Seam Weld/AuSn Solder Seal is increased in Y2, this number will be larger than 0. Thus, from the Y1 screen, the overlap may, for example, be increased or decreased by changing the Total Welds and Pitch.

The Y2 Overlap, mm may include the center overlap on Y2 based upon the value of Y1, or Y1 based upon the value of Y2. For example, if the number of Power Pulse for Seam Weld/AuSn Solder Seal is increased in Y1, this number may, for example, be larger than 0. From the Y2 screen, the overlap may be increased or decreased by changing the Total Welds and Pitch.

The X1 Overlap, mm may include the center overlap on X1 based upon the value of X2, or X2 based upon the value of X1. For example, if the number of Power Pulse for Seam Weld/AuSn Solder Seal is increased in X2, this number may, for example, be larger than 0. From the X screen, the overlap may be increased or decreased by changing the Total Welds and Pitch.

The X2 Overlap, mm may include the center overlap on X2 based upon the value of X1, or XJ based upon the value of X2. For example, if the number of Power Pulse for Seam Weld/AuSn Solder Seal is increased in X1, this number may, for example, be larger than 0. From the X2 screen, the overlap may be increased or decreased by changing the Total Welds and Pitch.

An example setting for Y1 and Y2 (or X1 and X2) may be Seal Ring Length/2, which may, for example, be the start of programming this feature. The number selected may, for example, be chosen by how much overlap of the molten material in Seam Weld or Seam AuSn is desired.

A Table Speed, radians/second may be the speed at which the table holding the package/seal ring/cover travels under the electrode. A Time Between Welds may be automatically generated for a user. For example, for a (e.g., large) time between Welds/AuSn solder, one may, for example, increase the time between Welds by Increasing/Decreasing table speed and or Pitch Distance. There may be many process conditions involved in this, such as the length, width and depth of molten material flow, amount of overlap desired on each of these, the heat input/average heat injected per distance traveled, etc.

Power (e.g., for Hermetic Cover Seal to Hermetic Package Seal of Microelectronic package) may be, for the purpose of resistance seam welding, where an electrodes roller rolls down package, and a located heat may, for example, be formed at the point of contact resistance, where cover/seal ring interface is then heated.

A wave synthesis technology may be utilized with the power supply, where there is DC Power Pulse Control (e.g., for which 12 parameters may be provided along with wave sculpting) and an AC Weld Transformer for rapid response. This may, for example, be referred to as DC Welding. DC Welding may, for example, be performed using an AC Transformer. The AC transformer may make the electrodes less sticky than if using a DC Transformer.

Figure 7B:
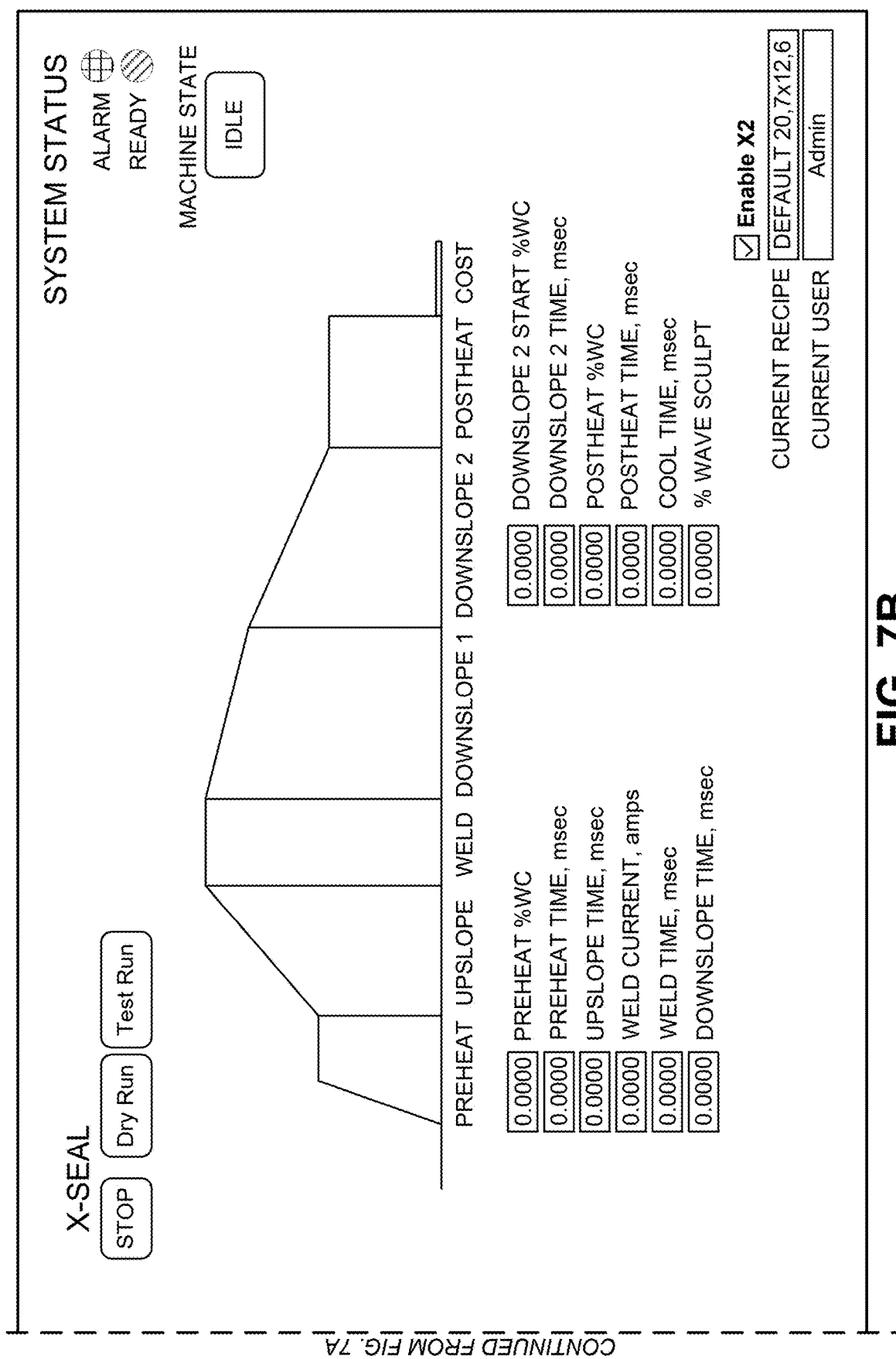

FIG. 7B illustrates displaying power related information (e.g., power parameters and the waveform) associated with the sealing process. 12 power parameters may be described herein. The combination of power parameters may, for example, be applied in a Power Pulse for Seam Weld/Seam AuSn Cover Seal. The parameters are listed in FIG. 7B. The power parameters may include one or more of: a preheat, a preheat time, an upslope time, a weld current, a weld time, a first downslope time, a second downslope time, a downslope start associated with the second downslope time, a post heat, a post-heat time, a cool time, or a wave sculpting percentage.

In a Rotary Seal, the Electrode Gap may be programmed to control the space between the electrodes. There may, for example, be several needs for this, such as size of package (e.g., the smaller the package, the smaller the gap—the electrode edge may not roll on the cover/seal ring).

Degrees of Rotation may be programmed. The positions where the rotation is to start and stop may be programmed This may, for example, determine overlap, which may be unlimited. The package may be sealed in sections, or the package may rotate multiple times to heat the molten material and have it reflowed.

The RHS may be associated with an automatic processor where every aspect of the process is digitized, and there may be no mechanical adjustments between one package to the other. The RHS may, for example, include a vision processing apparatus such as an aperture, focus, optics, lighting, gas pressure and flow.

A monitor may be available in AC or DC Power. The Secondary Weld Transformer and A/D Converter may, for example, be located in a NEMA box. The entire control system may be mounted on the Robotic Cover Sealer and may be low voltage DC powered for safety.

The machine may be controlled by a match set of Beckhoff Control System, Controllers, Motors, Encoders and Source Code. The machine may, for example, be configured with coordinated Beckhoff architecture. With regards to a Hermetic Package Cover Seal, Seam Weld or Seam AuSn Solder, operation may be fully digitally controlled with no knob turning.

Seam Weld and Seam AuSn Solder seal operation may have two opposing wheels, which may roll over the lid which is fitted on top of the seal ring of the package. When the electrodes contact the lid, there may, for example, be electrical power applied, where the cover completes the circuit. At the point of contact for the electrodes, for example, a localized heat is created, which can metal solder metallic property elements. For rectangular or square packages, the four corners may be sealed from the motion coverage of each of the parallel sides, resulting in corner overlap, so that the entire perimeter of the package is sealed by metal flow resulting in package being gas tight or hermetic. For rotary sealing, overlap occurs by having the package sealed over 180 degrees.

Principle of Parallel seam welding, for example, may be described in https://www.avio.co.jp/english/products/assem/principle/seam/. Team Wilder A seam welder may, for example, be intended for making a can by putting a lid on a case in which an electronic component is placed. The case may, for example, be made of metal or ceramic and may be called a package and a lid may be made of metal. The purpose of putting a lid may be the same as that for canned food. It is intended to shut off the outside air from the component inside the package for stable operation for a long period of time. This may be referred to herein as hermetic sealing.

The type of components placed inside the package may, for example, include crystal devices, mems, sensors, and optical devices. Seam sealing may be the same as resistance welding. Seam sealing may, for example, weld the package and the lid using pressure force and electric. A lid may, for example, be placed on a package and a pair of roller electrodes may be applied on the rim of a lid. An electric current may be applied through the package and the lid via these roller electrodes. The contact section of the roller electrode and the lid may, for example, generate heat because of high resistance welding. Using this heat in seam sealing electric current may be applied. The roller electrode may roll along the rim of a lid as the electric current is applied to an area is welded. When such welding is performed continuously for the entire circumference of a lid without a gap, the package will have been hermetically sealed. Seam sealing may be associated with a welded section resembling the seam in sewing.

If there is a gap in a seam that causes a leak, a hermetically sealed package may, for example, be defective. Therefore, after the same sealing, packages may be put through a leak inspection. Resistance seam sealing, for example, may be described as show at https://www.youtube.com/watch?v=oMOHMm8QkD4. The lid may be tacked in place. The lid may be placed by hand or automated with a cover pick and place to be followed by tack.

An example of a system and sealing of package may, for example, be shown at https://www.youtube.com/watch?v=-juRz1Bg3wA. Parallel Seam Sealers may be indicated at: https://amadaweldtech.com/product-category/hermetic-seam-sealing/parallel-seam-sealers/. Parallel seam welding may, for example, be indicated at: https://www.avio.co.jp/english/products/assem/principle/seam/.

For a Seal Ring Alignment, the vision system may, for example, align the Y and X linear alignment for each of the 4 seals, Y1, Y2, X1, X2, in linear Seam Weld and Seam AuSn Solder Seals.

For Lid Pick and Place, a vacuum may pick up a lid and release the vacuum after the lid is in position to be placed. The vacuum level of the pickup may, for example, be PC programmable as is the flow off or puff off of gas from nozzle changing from vacuum to pressure to release the cover from the nozzle.

There may be a Weld Counter, where a user may program the number of Welds which will generate an alarm by this programmed number. This may, for example, be user programmable. When the Alarm goes off, the user may, for example, click Replace Electrodes to restart with existing electrodes or changing of electrodes or may program a different electrode track for the package to seal on.

When an angle electrode is used and a different electrode to lid contact point is used, the system, which is standard on every seal, may teach itself the corner of the particular package. A round electrode (wheel) with 12 mm dimension may, for example, have a larger surface contact compared to an electrode compared to a 4 mm. While the change in surface area does affect the point of contact resistance (Ohms Law), it affects weld coverage of the corner for a number of reasons. The Robotic Cover sealer may, for example, automatically teach itself a corner of a weld, so that when changing this parameter, there is not a need to change the programming of the machine with standard operations.

The lid pick and place may have many electrical, mechanical, software, actions and more changes for Hermetic Cover Seam Welds and Seam AuSn Solder hermetic sealing. The downward looking camera may, for example, perform (e.g., all) downward looking vision functions. There may be two cameras on the robotic cover sealer.

The materials, package, and cover may be located on the sealer stage, and the start button may be pressed. Changes between package and cover, within the FOV of specific optics, the complete operation of the Seam Weld and Seam AuSn Cover Seal may, for example, be automatically performed. There may not be a need to use (e.g., special) fixtures or hold down fixtures or sealing between one package type than the other. The operation may, for example, be very quick to change from one package type to the other. The downward looking camera may identify the location of each.

In examples, the cover material may be loaded upside down. The vision processing software will, for example, use this image and provide an alarm and interlock to prevent sealing until this is fixed. The table may return to the load/unload position for materials load correction.

In examples, the covers may stick together. For example, an integrated laser detector may, for example, be used to measure the height of the lids vs. what is programmed. If this does not match the programmed value, the RHS may, for example, provide an alarm and interlock to prevent sealing until this is fixed. The table may return to the load/unload position for materials load correction.

The downward looking camera/light ring may capture the image of the seal ring. Based upon these two images, the cover may be placed, with the vision processing managing to keep the edge of the cover to edge of a seal ring, equal-distant on all four sides. The downward looking camera/light ring may be applicable to hermetic Seam Weld and Seam Solder Hermetic Cover Sealing. The Camera and Light Ring may, for example, be mechanically joined, so they move together. The vision systems may, for example, be calibrated with a reticle for most accurate dimension capture. The light ring may, for example, be on an axis, so it can go up and down over the package for illumination. The cover may, for example, be placed on top of the seal ring. The vision system may, for example, inspect the location of the lid and package on the seal ring to see whether it meets the programmed distances. The downward looking camera may inspect the dimension of the lid on the seal ring. It may be determined, with the downward looking camera, whether the inspection passes or fails (e.g., automatically or manually).

The objective, for example, of the automatic cover pick and place to the seal ring include: obtaining equal distance from the edge of the cover to edge of the seal ring on all four sides within a programmed tolerance and measuring the distance after lid placement and/or after lid tacking; making sure a cover is not overhanging any size of the lid, as illustrated in FIG. 6; and based at least on the set of cover parameters and the set of package parameters, accurately place the cover on top of the package. Accurately placing the cover on the top of the package may include determining an orientation of the cover. Accurately placing the cover on the top of the package may include determining that one or more edges of the cover to edge of the seal ring are equidistant on one or more sides of the cover.

For a hermetic cover seam weld, automatic alignment may, for example, occur by making opposing sides, edge of cover to edge of seal ring equal. This assumes the same point of contact of opposing sides seam weld electrode contact. The inspection of lid tacking may enable programmed interlocks for differences between an edge of Seal Ring and Edge of Package on all four sides (or 2 comparisons on Y side and 2 comparisons on X side); and/or the numbers.

For large packages, alignment may occur by looking at 4 corners of cover and seal ring; or optics may be changed. For large packages, the covers may, for example, be placed manually. The vision system may be programmed to inspect the manual cover placement. The package may be moved to the Cover Tack. The cover may be spot tacked to the package seal ring metallization or metal structure, so that it may not result in further movements before, during or after the sealing operation.

In a sealing operation, a seal may be created in four passes. A seal may be created from the center of package to one end; the package may be rotated 180 degrees, and then the other side, 90 degree rotation, where a seal is created from a center of package to one end, rotate by 180 degrees from the other end to complete the cover seal.

In the upper left hand side of screen, the direction of the seal may be displayed. If there is a rectangle cover/seal ring on package, the long side may, for example, be sealed first. Y1 may be the first seal from center to end of the package. The table may, for example, rotate 180° and Y2 may seal from the center of the table to the edge.

The package may, for example, rotate 90°, so the package will seal in X1 direction from center of package to the edge of the seal ring, rotate 180°, and seal in X2 direction. The seal may be complete. With a square package, the alignment of the package may, for example, be done in any manner, and there may be a top side and bottom side of the package for both rectangular and square packages. A Seam Weld Tack or Seam AuSn Solder Tack may, for example, be applied to the cover and to the seal ring so that the cover does not move.

After lid placement, the vision system may inspect the cover placement positioning to verify that it is in a desired working location before tack, before hold down, or magnet up in the cover sealing. Cameras and mechanical axis may be calibrated using a reticle, so that the camera may capture/measure dimensions on both the cover and seal ring. There may be a Z axis mechanism system, using a motorized axis and an idler, so that the distance between the camera and light ring is fixed. This may enable a (e.g., seamless and/or easy) change between package sizes and heights. A final camera axis adjustment may be provided for fine height changes for differing package/seal ring sizes and plating surfaces including cover plate of Au, Au/Ni or Ni and Package Seal Ring surface of Au, Au/Ni or Ni) The calibrated reticle may be used so that the dimensions of an examined cover and seal ring are correct as to the calibration of the reticle. The camera and light ring may, for example, be in a fixed position so that the image of various heights of hermetic package seal rings and covers may be illuminated, with accurately measured data, for the cover placement onto seal ring The light ring may have an additional axis for the final up down motion. These may, for example, be digitally controlled and set in a PC program file. To change from one package and lid to another may be associated with a PC program change. There may not be a hardware adjustment.

Aspects of the (e.g., venturi generated) vacuum for cover pick up may be controlled through software including gas pressure, flow and puff off. The Z axis mechanism may, for example, control the height of the vacuum picker nozzle. The vacuum picker nozzle may, for example, be a metal tube with with a metal machined nozzle which is precision screwed in and out, in order to restrict any movement. This may keep the nozzle in a center of rotation. The picker nozzle may have an additional axis for final up down motion.

The one Z axis mechanism may, for example, be clean room rated to prevent debris from dropping on the lid and package both before, during, and after sealing. The one Z axis mechanism may, for example, control height for one or more of the following: Downward Looking Vision Camera; Downward Camera Light Ring; Additional Axis for Camera; Vacuum Picker Nozzle; Additional Axis for Pick Nozzle; Hold Down; Additional Axis for Hold Down; Unidirectional Left and Right Electrode Assemblies; Additional Axis for Left and Right Electrode; or Height and Force, Including electronic transducer in each Left and Right Electrode.

There may be an X, Y, Theta Table underneath the electrodes which may position a package in a center of a rotation, so when electrodes open/close, the edge of the package seal ring/cover may be located on the same location of electrodes on a left and right side of electrodes when sealing.

The machine may include 12 axes on the machine. Automation may be added, which may add more axes (e.g., 12 more axes). Axes may include one or more of the following: Theta on Sealer Table; Magnet Up/Down Axis to raise Magnet Under Seal Table, tooling to hold down package; X Axis; Y Axis; the rest of the apparatus may have height control, Z, by multiple A support height mechanism, with cleanroom class 10 actuators, to raise and lower the entire apparatus for the particular process steps (e.g., Seal Unison Drive on X Axis on Single Z Axis; Left Electrode Up/Down Force Axis on Single Z axis; Right Electrode Up/Down Force Axis on single Z: Combined Light Ring/Camera Height Controlled by Single Z (e.g., Downward Looking Vision Camera and Downward Looking Ring Light, and an added axis for ring light Z); Pick Place Head on Single Z (e.g., Theta for Pick Place Head and additional Z axis for picker); or Hold Down Fixture on Common Z (e.g., Additional Z axis for Hold Down; Rolling end effector (Wheel, ball like roller ball pen, etc.)).

All axes may, for example, be operated with coordinated motions and may be controlled by motors, encoders, air piston, and sensors. Subject matter described herein may, for example, apply whether the machine is loaded/unloaded by a human operator or collaborative robot. Both may perform materials handling which may involve picking package from tray or carrier or placing package on to sealer stage or picking cover from tray or carrier and placing on stage.

With a collaborative robot, the above operation may be by a PC. Materials handling on input and output may, for example, be different or the same (e.g., carriers or trays—holding package and lids). A Parallel Seam Weld and Seam Solder resistance heating may join a metal cover to a metal seal ring to form a hermetic seal of a hermetic package containing microelectronic devices. Hermetic may be defined as the package leak rate according to U.S. Mil-STD-883 for Microelectronic Packages, Test Method 1014 Seal.

FIG. 8A illustrates a hold down mechanism 802, such as a top hold down. Fixtures must ensure that parts are securely held in their intended positions throughout welding. Instead of using and switching between package-specific tools, the use of slight force to keep a package and the cover in place may be desirable.

As illustrated, the design of the hold down may, for example, allow for slight flexing of the hold down (e.g., a flex point 804), providing enough give to secure the package firmly (e.g., with a contact point 806) without additional parts for stabilization. The flexing capability may enable the hold down to accommodate minor variations in package height or surface irregularities while maintaining consistent downward pressure. The hold down may, for example, eliminate supplementary clamping components associated with securing the package and/or the cover during a sealing process (e.g., the sealing process may be fixture free).

FIG. 8B illustrates the RHS at a time (e.g., t=1), where, at 808, the electrode, may, for example, be brought in proximity to the cover. The hold down may, for example, extend towards the cover (e.g., before the hold down makes contact with the cover). The preemptive movement of the hold down may prepare the RHS for the imminent sealing operation, positioning the hold down before applying pressure on the cover upon the package.

FIG. 8C illustrates the RHS at a time (e.g., t=2), where the RHS executes the sealing process. At 810, the hold down may, for example, be actively engaged with the cover, exerting a force to hold the cover in place The application of pressure by the hold down may be, for example, synchronized with the activation of the electrode, which may apply heat to the cover, causing the hermetic sealing process. The downward force exerted by the hold down may, for example, prevent displacement of the cover due to the thermal expansion or movement that may occur during welding.

FIG. SD illustrates the RHS at a time (e.g., t=3), where, at 812, the RHS may, for example, retract the hold down away from the cover following the sealing process. The retraction may, for example, depict the completion of the sealing operation, allowing the newly sealed package to be released from the pressure of the hold down. The hold down's retraction may be controlled, enabling the integrity of the seal to be maintained without disruption, for example, as the cover and package cool and the materials solidify after the removal of the electrodes in the hermetic sealing process.

FIG. 9 illustrates an example cooling mechanism with fins attached to the electrode. In the depicted figure, Engineered Fins for Active Air Cooling 902 may be associated with the electrode(s) of the Robotic Cover Sealer (RHS). A finned structure may be attached to or part of the electrodes. The fins 902 are designed to dissipate heat efficiently, functioning as part of a cooling mechanism to manage the thermal load during the sealing process.

The fins 902 may be oriented in parallel lines, suggesting that air flows through the fins 902 (e.g., channels) to carry away excess heat. The placement of the fins 902 in relation to the electrode suggests that they are positioned to maximize exposure to ambient air or forced air flow, thus enhancing the cooling effect. The active cooling system may be associated with preventing overheating of the electrodes, which could otherwise compromise the integrity of the hermetic seal or damage the microelectronic components within the package.

FIG. 9 indicates two states or positions of the finned structure relative to the electrode, possibly representing the system during active cooling with fins extended and a retracted position when cooling is not required or when the RHS is in idle mode. The dynamic nature of the finned structure may allow for adjustable cooling intensity corresponding to the heat generated during the sealing process, maintaining a temperature range for the electrode and the surrounding components.

The cooling mechanism may enable the RHS to maintain a stable operating temperature, provide consistent sealing conditions, and prolong the electrode's operational life. By effectively managing the thermal output, the system may prevent the transfer of heat to the package, and protect electronic components housed within the package.

The processes/methods described herein may be implemented in a computer program, software, and/or firmware incorporated in a computer-readable medium for execution by a computer and/or processor. Examples of computer-readable media include, but are not limited to, electronic signals (transmitted over wired and/or wireless connections) and/or computer-readable storage media. Examples of computer-readable storage media include, but are not limited to, a read only memory (ROM), a random access memory (RAM), a register, cache memory, semiconductor memory devices, magnetic media such as, but not limited to, internal hard disks and removable disks, magneto-optical media, and/or optical media such as CD-ROM disks, and/or digital versatile disks (DVDs). A processor in association with software may be used to implement a physical device, a virtual device, any host computer.

What is claimed is:

1. A sealing system comprising:
a processor configured to at least:
obtain input data comprising one or more of a set of package parameters associated with a package, a set of cover parameters associated with a cover, a set of seal ring parameters associated with a seal ring, or a set of power parameters;
based at least on the set of cover parameters and the set of package parameters, accurately place the cover on top of the package;

determine, using a vision system associated with the hermetic sealing system, that a clearance condition associated with the package and the cover is satisfied based on the obtained input data;

based on the clearance condition being satisfied, determine a height associated with an electrode, wherein the height associated with the electrode is adjusted based on one or more of the set of cover parameters or the set of package parameters;

based on the determination of the height associated with the electrode, position a hold down to engage with the cover, position the electrode, and determine a force to apply, using the electrode, to the cover and a seal ring associated with the package; and seal the cover to the package using the determined force to apply to the cover and the seal ring associated with the package, wherein the hold down remains engaged with the cover when the cover is sealed to the package.

2. The system of claim 1, wherein the set of package parameters comprises a set of package dimensions or a package type, wherein the set of package dimensions comprises one or more of a set of package height dimensions, a set of package width dimensions, or a set of package length dimensions, wherein the set of cover parameters comprises a set of cover dimensions, wherein the set of cover dimensions comprises a type of cover comprises one or more of a cover height, a cover width, or a cover length, and wherein the set of seal ring parameters comprises a seal ring height, a seal ring length, a seal ring corner radius.

3. The system of claim 1, wherein the input data comprises a tool height, a block height, a first pulse squeeze time, a last pulse hold time, a set of offsets, an overlap, a power pulse pitch, a number of welds, a duration between welds, an edge detection force, a minimum weld force and a weld end distance from a corner, wherein the offsets are based on a seal type, wherein the seal type is one of an X1 seal, an X2 seal, a Y1 seal, a Y2 seal, or a rotary seal.

4. The system of claim 1, wherein accurately placing the cover on the top of the package comprises determining orientation of the cover.

5. The system of claim 1, wherein accurately placing the cover on the top of the package comprises determining that one or more edges of the cover to edge of the seal ring are equidistant on one or more sides of the cover.

6. The system of claim 1, wherein the processor being configured to determine that the clearance condition is satisfied comprises the processor being configured to determine that one of the cover parameters is within a predetermined tolerance value.

7. The system of claim 1, wherein the set of power parameters comprises one or more of: a preheat, a preheat time, an upslope time, a weld current, a weld time, a first downslope time, a second downslope time, a downslope start associated with the second downslope time, a post heat, a post-heat time, a cool time, or a wave sculpting percentage.

8. The system of claim 1, wherein the processor is further configured to determine the force to apply to the cover and the seal ring based on one or more of an edge detection force or a minimum weld force.

9. The system of claim 1, wherein the processor is further configured to robotically obtain the input data, determine that the clearance condition is satisfied, determine the height associated with the electrode, and determine to apply the force to the cover and the seal ring.

10. The system of claim 1, wherein based on the determination that the clearance condition associated with the package and the cover is satisfied, the processor is further configured to:

tack the cover to the seal ring such that the cover is restricted from movement; and inspect, using the vision system associated with the hermetic sealing system, a placement of the cover based on the tacked cover.

11. The system of claim 1, wherein the electrode is one of a set of electrodes capable of moving together along an axis, and wherein processor is further configured to determine and apply a force using the electrode.

12. The system of claim 1, wherein the force is one of a minimum weld force or an edge detection force.

13. The system of claim 1, wherein being configured to seal the cover to the package comprises the processor being configured to apply a power pulse based on one or more of the set of power parameters.

* * * * *